US008786396B2

(12) United States Patent
Leung et al.

(10) Patent No.: US 8,786,396 B2
(45) Date of Patent: Jul. 22, 2014

(54) HEATER DESIGN FOR HEAT-TRIMMED THIN FILM RESISTORS

(75) Inventors: Calvin Leung, Singapore (SG); Olivier Le Neel, Singapore (SG)

(73) Assignee: STMicroelectronics Pte. Ltd., Singapore (SG)

( * ) Notice: Subject to any disclaimer, the term of this patent is extended or adjusted under 35 U.S.C. 154(b) by 0 days.

(21) Appl. No.: 13/339,968

(22) Filed: Dec. 29, 2011

(65) Prior Publication Data

US 2012/0119872 A1  May 17, 2012

Related U.S. Application Data

(63) Continuation-in-part of application No. 12/562,026, filed on Sep. 17, 2009, now Pat. No. 8,242,876.

(60) Provisional application No. 61/097,805, filed on Sep. 17, 2008.

(51) Int. Cl.
*H01C 3/04* (2006.01)
(52) U.S. Cl.
USPC ............... 338/25; 338/22 R; 338/22 SD
(58) Field of Classification Search
USPC ................ 338/22 R, 22 SD, 25
See application file for complete search history.

(56) References Cited

U.S. PATENT DOCUMENTS

| 3,289,046 A | 11/1966 | Quentin |
| 3,416,959 A | 12/1968 | Cormia |
| 3,621,446 A * | 11/1971 | Smith et al. ............ 338/23 |
| 4,125,854 A | 11/1978 | McKenny et al. |
| 4,808,009 A * | 2/1989 | Sittler et al. ............ 374/178 |
| 5,037,766 A | 8/1991 | Wang |
| 5,135,888 A | 8/1992 | Chan et al. |
| 5,503,878 A | 4/1996 | Suzuki et al. |
| 5,623,097 A | 4/1997 | Horiguchi et al. |
| 5,635,893 A * | 6/1997 | Spraggins et al. ........ 338/48 |
| 5,640,023 A | 6/1997 | Balasinski et al. |
| 5,821,960 A | 10/1998 | Mitani |
| 6,504,226 B1 | 1/2003 | Bryant |
| 6,891,747 B2 | 5/2005 | Bez et al. |
| 6,960,744 B2 * | 11/2005 | Adkisson et al. ........ 219/494 |
| 7,259,040 B2 | 8/2007 | Pellizer et al. |

(Continued)

FOREIGN PATENT DOCUMENTS

WO  2005093868 A1  10/2005

OTHER PUBLICATIONS

Hieber, K., and R. Dittman, "Structural and Electrical Properties of CrSi2 Thin Film Resistors," Thin Solid Films 36(2):357-360, Aug. 1976.

(Continued)

*Primary Examiner* — Kyung Lee
(74) *Attorney, Agent, or Firm* — Wolf, Greenfield & Sacks, P.C.

(57) ABSTRACT

A heater design for post-process trimming of thin-film transistors is described. The heater incorporates low sheet-resistance material deposited in non-active connecting regions of the heater to reduce heat generation and power consumption in areas distant from active heating members of the heater. The heating members are proximal to a thin-film resistor. The resistance of the thin-film resistor can be trimmed permanently to a desired value by applying short current pulses to the heater. Optimization of a heater design is described. Trimming currents can be as low as 20 mA.

19 Claims, 28 Drawing Sheets

(56) References Cited

U.S. PATENT DOCUMENTS

| | | | |
|---|---|---|---|
| 7,338,637 | B2 | 3/2008 | Pease et al. |
| 7,427,926 | B2 | 9/2008 | Sinclair et al. |
| 2002/0162829 | A1* | 11/2002 | Weber et al. ............ 219/209 |
| 2003/0155591 | A1 | 8/2003 | Kreupl |
| 2004/0021740 | A1 | 2/2004 | Bell et al. |
| 2005/0052498 | A1 | 3/2005 | Delametter et al. |
| 2007/0189053 | A1 | 8/2007 | Pellizzer et al. |
| 2010/0073122 | A1 | 3/2010 | Le Neel et al. |
| 2012/0049323 | A1 | 3/2012 | Ng et al. |
| 2012/0049324 | A1 | 3/2012 | Le Neel et al. |
| 2012/0049997 | A1 | 3/2012 | Lim et al. |
| 2012/0168754 | A1 | 7/2012 | Le Neel et al. |
| 2012/0170352 | A1 | 7/2012 | Le Neel et al. |

OTHER PUBLICATIONS

Nishida, I., and T. Sakata, "Semiconducting Properties of Pure and Mn-Doped Chromium Disilicides," *Journal of Physics and Chemistry of Solids* 39(5):499-505, Jan. 1978.

Nishida, S., et al., "A New Self-Aligned A-SI TFT Using Ion Doping and Chromium Silicide Formation," *Materials Research Society Proceedings* 219:303-308, Apr. 1991.

Privitera S., et al, *Morphological and electrical characterization of $Si_xCr_yC_zB_y$ thin films*, Microelectronic Engineering 87:430-433, 2010.

Colgan et al., "Phase formation in Cr-Si thin-film interactions," *Appl. Phys. Lett.* 37(10):938-940, Nov. 15, 1980.

Galatsis et al., "p-and n-type Fe-doped Sn02 gas sensors fabricated by the mechanochemical processing technique," *Sensors and Actuators B* 93:562-565, 2003.

Hwang et al., "A novel structured polysilicon thin-film transistor that increases the on-off current ratio," *Semicond. Sci. Technol.* 18:845-849, 2003.

Sukhawuttichai et al., "Effect of Bi203 Addition on the Microstructure and Properties of the Sn02 Varistor System," *33r$^d$ Congress on Science and Technology of Thailand*, Walailak University, Nakhon Si Thammarat, Thailand, Oct. 18-20, 2007, pp. 1-4.

Yamauchi et al., "Polysilicon Thin-Film Transistors with Channel Length and Width Comparable to or Smaller than the Grain Size of the Thin Film," *IEEE Transactions on Electron Devices* 38(1):55-60, Jan. 1991.

Tuite, D. "Resistor Trimming," Electronic Design, ED Online #17261, URL–http://electronicdesign.com/article/power/resistor-trimming17261.aspx, dated Oct. 25, 2007.

* cited by examiner

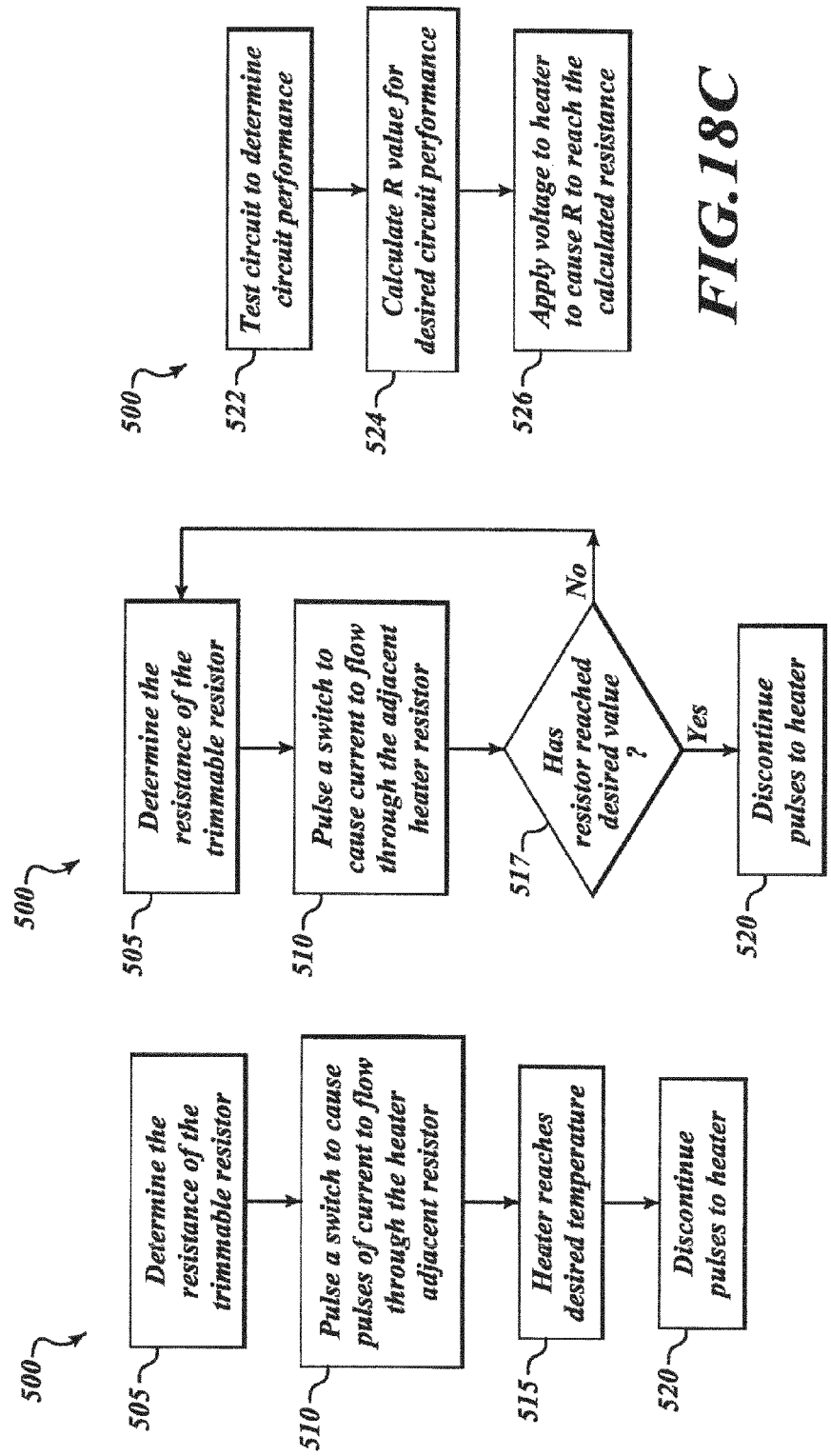

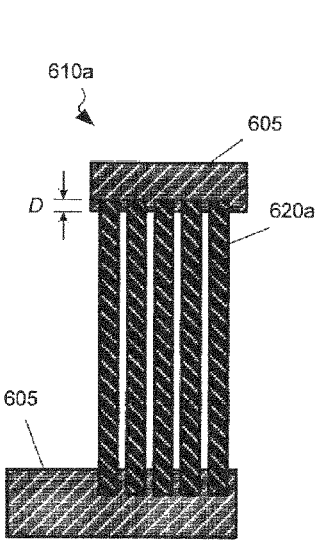
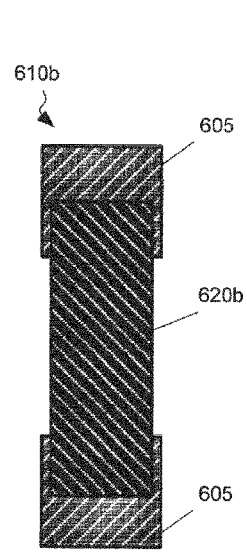
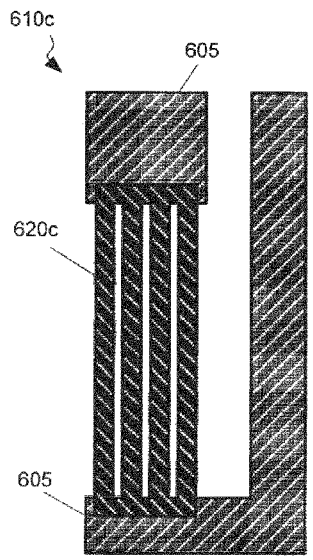
FIG. 21A    FIG. 21B    FIG. 21C
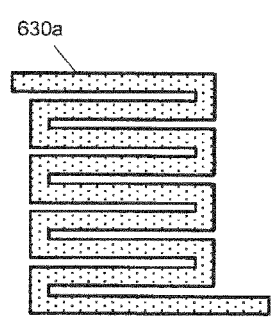
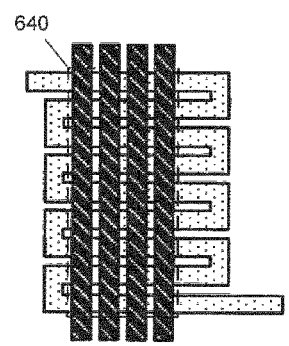
FIG. 22A    FIG. 22B

HEATER DESIGN FOR HEAT-TRIMMED THIN FILM RESISTORS

CROSS-REFERENCE TO RELATED U.S. APPLICATIONS

The present application is a continuation in part of U.S. patent application Ser. No. 12/562,026 filed on Sep. 17, 2009 now U.S. Pat. No. 8,242,876, which claims priority to U.S. provisional patent application No. 61/097,805 filed on Sep. 17, 2008, both of which are incorporated herein by reference.

BACKGROUND

1. Technical Field

This description generally relates to the field of resistance trimming.

2. Background

Traditional methods of trimming resistors which are embedded within integrated circuits are limited to pre-assembly stages of manufacturing or require forfeiture of significant silicon real estate to obtain precision trims. One method includes using a laser to cut away portions of the resistor to alter its resistance. This method requires access to the fabrication layer in which the resistor is deposited. Additionally, this method cannot be accomplished during the application of the device containing the resistor. Another method includes electrical fusing. Electrical fusing, however, is limited to a binary correction of the resistance. In the alternative, electrical fusing may utilize large fuse bank structures to produce more precise changes in resistance. The tradeoff for more precise resistance trimming then becomes forfeiture of valuable silicon real estate. In summary, traditional resistor trimming methods require visible access to the resistor of interest, or the methods require forfeiture of silicon real estate to effectuate precise results.

BRIEF SUMMARY

The following disclosure relates to a method of trimming a resistor using a heater disposed in close proximity to the resistor in an integrated circuit. By applying a voltage to the heater, the temperature of the heater will increase. The generated heat permeates through a thermal conductor to the resistor, raising the temperature of the resistor. The composition of the resistor material is selected to be of a type that the resistance value of the resistor permanently changes based on the temperature the resistor is exposed to. Separating the heater from the resistor by one or more thermal separators and applying a voltage to the heater results in changing the resistance of the resistor. The resistance can be set at a selected value over a wide range of possible resistances.

According to one embodiment, a heat-trimmable resistor comprises a thin-film resistive element configured as a resistor that is connected to or connectable to a circuit. The heat-trimmable resistor further comprises a thin-film heating region proximal at least a portion of the thin-film resistive element, and an electrically-conductive material disposed in electrical contact with the thin-film heating region and having a lower sheet resistance than the thin-film heating region. The thin-film heating region may define an active area of the heat-trimmable resistor, and substantially cover a portion or substantially all of the thin-film resistive element. The electrically-conductive material may provide an electrical connection between the thin-film heating region and a conductive interconnect, and may reduce heat generation in non-active areas of the heat-trimmable resistor.

In one embodiment, the heat-trimmable resistor is connected to an amplifier in a feedback configuration that will affect the gain. The gain of an operational amplifier ("op amp") circuit can be controlled by the value of a feedback resistor. If a precise gain is needed by the circuit, the feedback resistor can be precisely tuned to achieve a desired op amp performance.

In another embodiment, the resistor is trimmed and used in a current sense configuration. In a current sense configuration, a resistor may be placed across the input terminals of an op amp. The op amp is used to sense and amplify the voltage drop across the resistor. Knowing the exact resistance of the resistor and the gain of the op amp will allow one to determine the amount of current flowing through the resistor for evaluating the parameter of interest. The value of the resistor can be more precisely set than just using standard process manufacturing techniques. The value of the resistance of the resistor will affect the range of currents detectable by the current sense configuration. For some sense circuits, a very low resistor may be preferred, while in other types of sense circuitry a higher resistance will provide more accurate sensing and better circuit performance. Thus, the ability to adjust the resistor may improve the effectiveness of a current sense circuit.

According to the embodiments provided herein, the value of the resistor can be modified after the integrated circuit is completed as well as at numerous different stages in the process. After the circuit has been completely formed, the circuit performance can be tested to determine the characteristics and parameters of the individual circuit components and transistor operation. The desired resistance value can be determined based on these tests.

When a circuit is designed, it is designed towards a target performance and specification. When the circuit is actually construed in silicon, the actual performance of the various components, such as transistors, capacitors and resistors, will be slightly different from the designed target value. One of the most difficult components to build to the exact design specifications is a resistor in silicon or polysilicon or a HIPO resistor. Accordingly, the circuit can be tested after it is constructed to determine the actual performance of the components. It can be tested at several locations, for example, the sheet resistance of the resistor can be tested, or the performance of the circuit, or the gain of the amplifier or some other results of the circuit can be tested to determine the actual characteristics of the circuit as actually formed. After this step, the resistance value needed to achieve a desired performance can be calculated. Then, the value of the resistance can be modified to be closer to the target value so that the circuit performs closer to the target specification.

As explained in more detail herein, after one or more tests are performed, the resistance is modified to have a more exact resistance value to provide the preferred performance characteristics for the particular circuit. The proper voltage is applied to the heater to cause the heater to reach desired temperature for heating of the resistor. The resistor is heated to a selected temperature which will cause it to reach a permanent resistance value. The heater is then turned off, and the resistance value of the resistor will have been placed at the desired value in order to achieve the preferred circuit performance. The value of the resistance has therefore been trimmed to a precise desired value.

This trimming of the resistor can occur at many different stages in the circuit process. It can occur at the wafer test stage in which the wafer is tested for circuit performance and operation, as is often done to test op amp performance or circuit feedback characteristics. Once the op amp characteristics are known from the test during the wafer testing, the preferred value of the resistance can be calculated and thereafter the appropriate voltage applied to the heater to cause the resistor to be trimmed to the selected resistance.

Alternatively, the resistive trim stage can occur at the individual die stage. After the wafer has been diced and individual dies are separated, in some embodiments, the die may be tested prior to packaging. Each individual die may be tested to determine the actual circuit parameters and then a desired resistance value. At this stage, the appropriate probes can be applied in order to heat the resistor to the desired value and therefore trim the resistance.

Alternatively, the resistor trimming can occur after the die is packaged. In this embodiment, the die is completely packaged and ready for use. Just prior to shipment, the manufacturer may place the die in a test socket and test various components of the circuit operation. If one or more resistors have a value which needs modification, then a voltage can be applied to the appropriate heater and the resistance can be modified to have the selected value in order to provide the desired circuit performance.

Alternatively, the purchaser of the chip may also trim the resistor just prior to using it in an end circuit. The user, upon purchase of the chip in its complete package form, may perform various tests on the integrated circuit package according to their desired end use of the completed circuit. The user can determine what resistance value is preferred and, by applying appropriate voltage to the terminals of the package, heat the resistor to the selected value and thus change the resistor to have a value which provides the preferred circuit performance.

In some embodiments, a method for trimming resistance in a heat-trimmable resistor comprises an act of applying current to a thin-film heating region that is proximal at least a portion of a thin-film resistive element, wherein the current is applied through an electrically-conductive material that is in electrical contact with the thin-film heating region and has a lower sheet resistance than the thin-film heating region. The electrically-conductive material may be disposed in non-active regions of the heat-trimmable resistor and provide an electrical connection between the heating region and an interconnect.

A process for making a heat-trimmable resistor may comprise acts of depositing a thin-film resistive material for which the resistance of the resistive material can permanently change upon exposure to temperatures between about 300° C. and about 1000° C., and patterning the thin-film resistive material to form a thin-film resistive element that may be connected to or connectable to a circuit. The process may further comprise depositing and patterning an electrically-conductive material to form at least one heater connector, and depositing and patterning a thin-film heating material subsequent deposition of the thin-film resistive element to form a heating region that electrically connects to the at least one heater connector. The electrically-conductive material may have lower sheet resistance than the thin-film heating material, and the heater connector may provide electrical connection between the heating region and an interconnect. The heater connector may be formed in non-active regions of the heat-trimmable resistor.

In summary, the value of the resistance can be trimmed at various stages in the product cycle, including at the initial manufacturing stage, at the wafer probe test stage, at the die test stage, at the packaged test stage, or, in some embodiments, even by the user after the chip has been purchased on the commercial market. This provides a wide range of alternative stages over which the value of the resistor can be trimmed well beyond what was possible in the prior art.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. Further, some figures are in schematic form and the particular shapes of some of the elements as drawn are not intended to convey information regarding the actual shape of the particular elements and have been selected for ease of recognition in the drawings.

FIGS. 18A-18C are flowcharts illustrating various methods of trimming a trimmable resistor, in accordance with embodiments of the invention.

FIGS. 21A-21C are plan views of heating elements for a heat-trimmable resistor, according to various embodiments.

FIG. 22A is a plan view of one embodiment of a thin-film resistive element.

FIG. 22B depicts heating members overlying a portion of the thin-film resistive element of FIG. 22A, in accordance with one embodiment.

DETAILED DESCRIPTION OF EMBODIMENTS OF THE INVENTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures and methods associated with integrated circuits and semiconductor manufacturing/packaging processes have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

Figure 1:
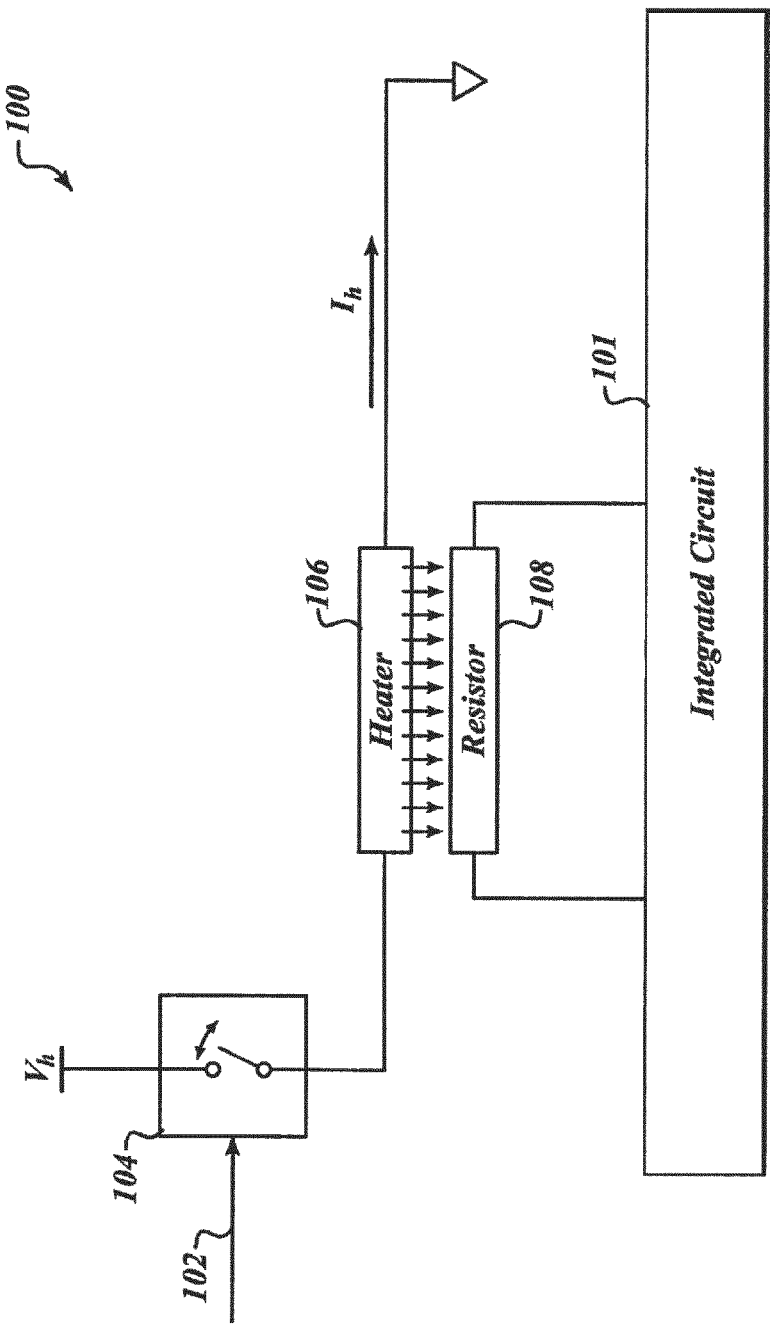
FIG. 1 is block diagram illustrating resistor trimming, in accordance with an embodiment of the invention.

FIG. 1 shows one embodiment of a trimming system 100 for trimming or changing the sheet resistance of a resistor. The embodiment includes an integrated circuit 101, an input signal 102, a switch 104, a heater 106, and a resistor 108. Additionally, trimming system 100 has a voltage source $V_h$, which provides a current $I_h$ to flow through heater 106. The resistor 108 is connected to an integrated circuit, shown here only in block diagram form.

Switch 104 is connected to heater 106 to selectively supply a voltage $V_h$. The switch opens and shuts in response to input signal 102. In one embodiment input signal 102 is a single pulse. In another embodiment, input signal 102 is a series of pulses. Switch 104 can be implemented using a variety of devices, including a transistor, either bipolar or MOS, or a triac, thyristor, or other switchable supply of a heating current $I_h$.

Heater 106 receives a voltage potential $V_h$ from switch 104. The value of the voltage potential $V_h$ is selected to achieve a desired current $I_h$ through the heater 106 based on the type of switch 104 used. In some instances, in which the switch 104 is an on/off switch that provides the full value $V_h$ to the heater 106, the value of $V_h$ is selected to provide a desired current $I_h$ for heating the resistor. This can be either a single pulse of a given voltage or, preferably, as a series of small pulses so that each incremental pulse provides incremental heating of the heater 106. A pulse wave modulation signal (PWM) can be applied via signal 102 to the switch 104. Alternatively, the voltage $V_h$ can be a known rail voltage, such as $V_{cc}$, $V_{pp}$, or other voltage rail available on the integrated circuit. In this case, the signal 102 can be applied as a pulse width modulation signal to provide short pulses of current flow $I_h$ to the heater 106. Alternatively, the signal 102 can be an analog-driven signal to provide a selected current flow through the heater 106. In such instances of an analog drive signal 102, a bipolar transistor is preferred for the switch 104. In other instances, a triac, thyristor, or MOS transistor may be used for the switch 104 in order to achieve a desired temperature in the heater 106.

Current I selectively flows through heater 106 to cause power to dissipate in the device. The temperature of the heater is defined by the Joule effect of power dissipation. This effect is mathematically represented as:

$$Q = R_{heater} \times (I_{heater})^2 \times t,$$

where

Q=the heat generated by a constant flow of current;
$R_{heater}$=the resistance of the heater;
$I_{heater}$=the current flowing through the resistor; and
T=time, the duration current is flowing through the resistor.

Power dissipating in heater 106 results in the temperature of heater 106 increasing. As will be discussed in association with FIG. 7, the composition of heater 106 will affect its resistance and therefore thermal response to current I passing through it. The heat generated by heater 106 permeates to resistor 108.

Resistor 108 is depicted in trimming system 100 as being in close proximity to heater 106. The proximity of resistor 108 to heater 106 will, in part, determine the amount of heat transferred between the devices, i.e., the thermal coupling. Whereas the resistance of many resistors temporarily varies with temperature, resistor 108 is of a type that will permanently change resistance upon exposure to a temperature within a range of temperatures. It can be of a type in which the resistance increases when subjected to heat, or the resistance decreases when subjected to heat.

A trimmable resistor, such as resistor 108, adds tremendous value to integrated circuit manufacturing in the way of precision while requiring very little additional hardware overhead. A voltage source is already available on all integrated circuits and in any wafer probe test. In addition, switches 104 are also available in standard integrated circuits 101. The additional hardware of a heater 106 and heater control circuit will be provided, however, such heaters and control circuits can easily be formed in standard integrated circuit processes and will only take up a small amount of space. A trimmable resistor such as is disclosed herein allows a large spectrum of trimming capabilities. In one embodiment, resistor 108 is part of a low-pass or high-pass RC filter where resistor 108 is inversely proportional to the cut-off frequency. In another embodiment, resistor 108 is the gain controlling feedback resistor of an amplifier circuit. In yet another embodiment, resistor 108 is a current sense resistor which may be connected across the inputs of a current sense amplifier. Since integrated circuits which produce results to within tight tolerances of the customer specification are of more value and if far outside of a customer specification often have to be discarded or sold undervalue, the ability to produce higher precision circuits becomes immensely valuable in a circuit manufacturing environment.

Figure 2:
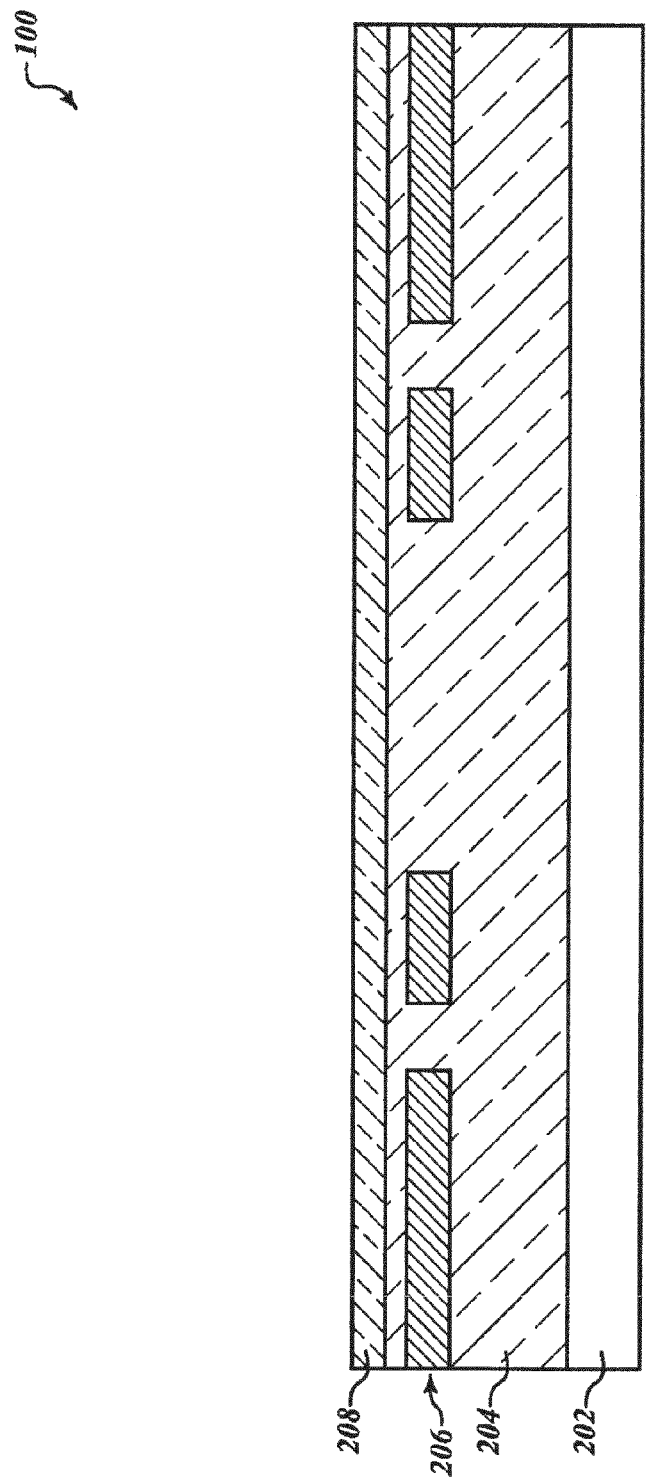
FIGS. 2 through 11 are cross-sectional views illustrating the plurality of processing steps that may be used in manufacturing the layers associated with the heater and trimmable resistor of FIG. 1, in accordance with an embodiment of the invention.

FIG. 2 shows a cross-sectional view of layers representing the integrated circuit 101 used in the fabrication of portions of trimming system 100. Trimming system layers 100 includes a silicon substrate 202, an insulator 204, a metal layer 206, and a layer 208.

Figure 16:
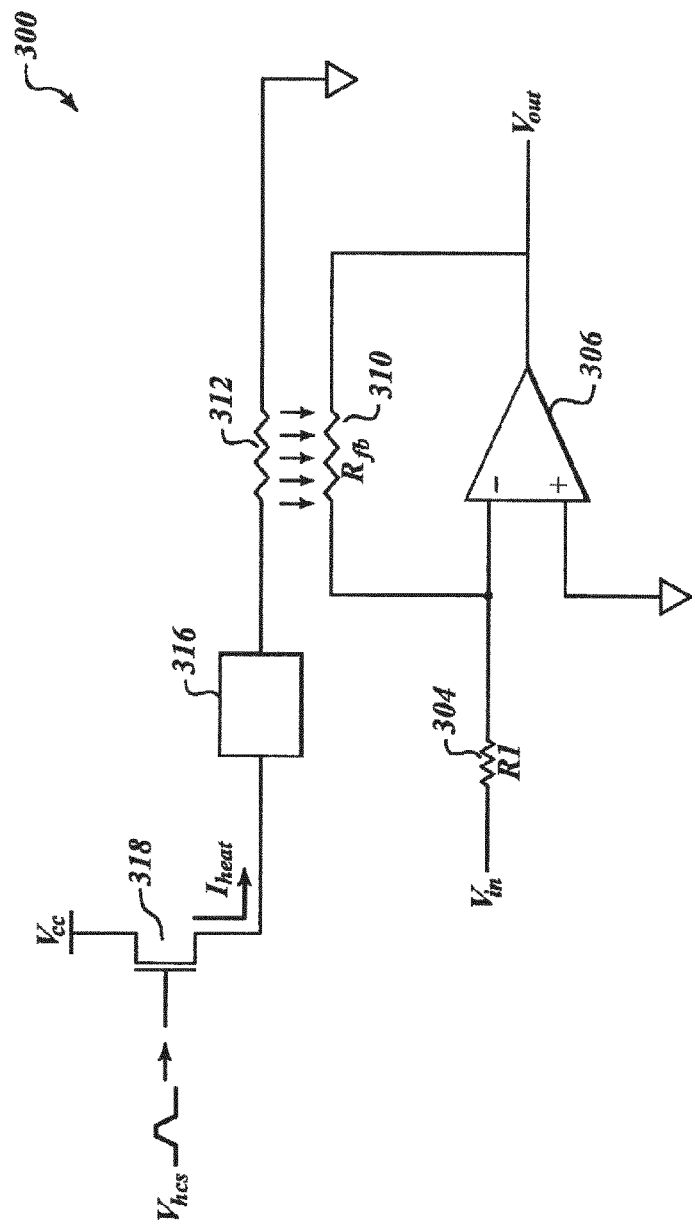
FIG. 16 is a circuit diagram illustrating an amplifier configuration using the trimmable resistor, in accordance with an embodiment of the invention.

Silicon substrate 202 may be a substrate of monosilicon. It may be a layer of polysilicon grown above a substrate or another process layer on which insulator 204 may be disposed. In one embodiment, silicon layer 202 contains active devices, while in another, it is on top of active devices, consequentially increasing the integration density of an integrated circuit upon which various layers may be disposed. The substrate 202 will have a number of other circuit components formed therein according to techniques well known in the art. For example, substrate 202 will include some or all of the components of the circuit of FIGS. 1, 16 and 17, shown elsewhere herein. The formation of transistors and interconnections to form specific circuits in a semiconductor substrate to make an integrated circuit are well known and therefore not described in detail herein. Any acceptable techniques may be used which are compatible with the processes and layers in the resistive heating circuit described herein.

Insulator 204 prevents various sections of metal layer 206 from having undesirable low-impedance connections. Insulator 204 may be one of many dielectrics known by one of skill in the art, including silicon dioxide ($SiO_2$), phosphosilicate glass (PSG), and boro-phospho-silicate glass (BPSG).

Layer 208 is disposed above insulator 204. Layer 208 acts as a layer that is an etchable foundation for a successive layer. Layer 208 is ideally an inefficient thermal conductor. As such, it protects electrical structures disposed below from heat dissipated in layers above, so as not to substantially impact electrical structures such as metal layers. In one embodiment, layer 208 is made of TEOS with a thermal conductivity on the order of 1.1 W/m/K. Layer 208 is etched to act as a socket for the resistor 108, as explained later herein. In another embodiment, layer 208 is implemented with an air void. In either embodiment, layer 208 is disposed in preparation for the subsequent resistive layer.

Figure 3:
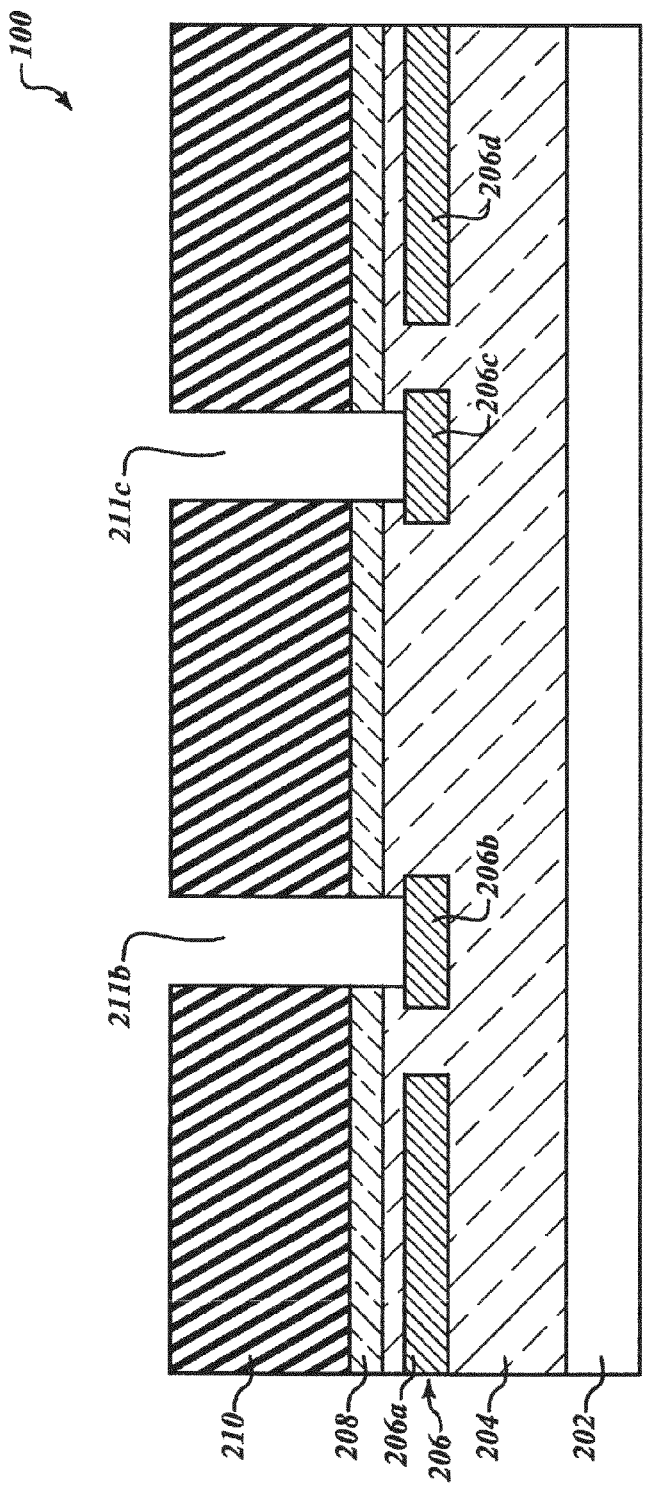

FIG. 3 shows the use of a photoresist 210, which is a temporary layer, within trimming system 100 to create via 211b and via 211c in layer 208 and insulator 204. The layer 206 has electrical isolated metal structures 206a, 206b, 206c, 206d, etc. The openings extend to and expose metal layer 206b and 206c. By exposing metal layer 206b and 206c, the next conductive layer may electrically couple to metal layer 206b and 206c.

Figure 4:
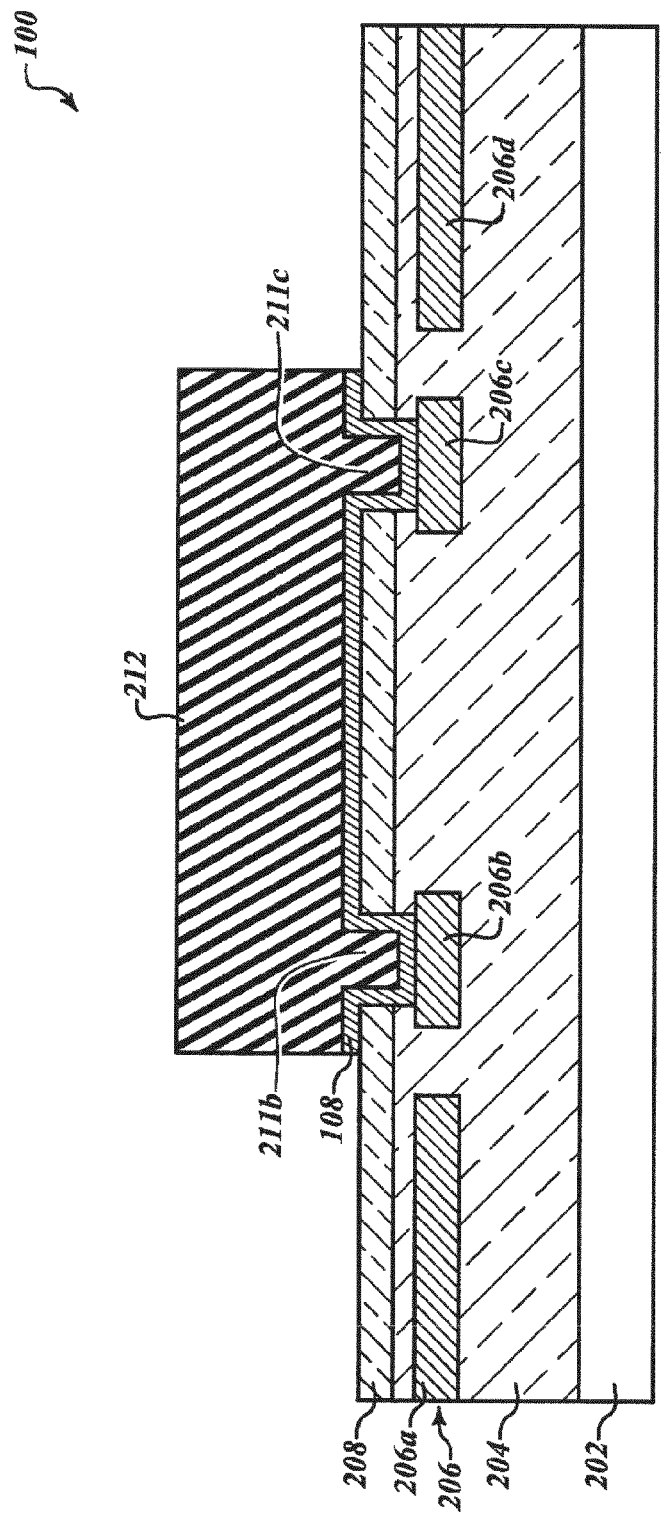

FIG. 4 shows that a resistor 108 has been deposited, the photoresist layer 213 is patterned and etched to obtain the desired dimensions of the resistor 108. Resistor 108 corresponds to trimmable resistor 108 of FIG. 1. Resistor 108 is connected to metal layer 206b and 206c. Resistor 108 has an initial resistance that is determined by its composition, length, width, and depth. In one embodiment, resistor 108 is a thin film resistor ("TFR"). In one embodiment, resistor 108 is a TFR with an initial sheet resistance of 1 kohm/sq. Resistor 108 is also composed of material that will permanently change after exposure to a range of temperatures. In one embodiment, resistor 108 comprises CrSi, a material with a low temperature coefficient of resistance. In one embodiment, the range of temperatures which will cause it to change resistance is 450° C. to 850° C.

As to avoid damage to resistor 108 and overheat proximate electrical structures, the duration of exposure of resistor 108 to the range of temperatures will be selectively controlled. In one embodiment, a permanent change in the value of resistor 108 occurs when resistor 108 is exposed to a temperature between 450° C. to 850° C. for a length of time between 1 μs and 1 ms. The purpose of the exposure is to permanently change the resistance of resistor 108, without rendering it fully or partially inoperable as a circuit element, as explained in more detail with respect to FIG. 19.

Figure 5:
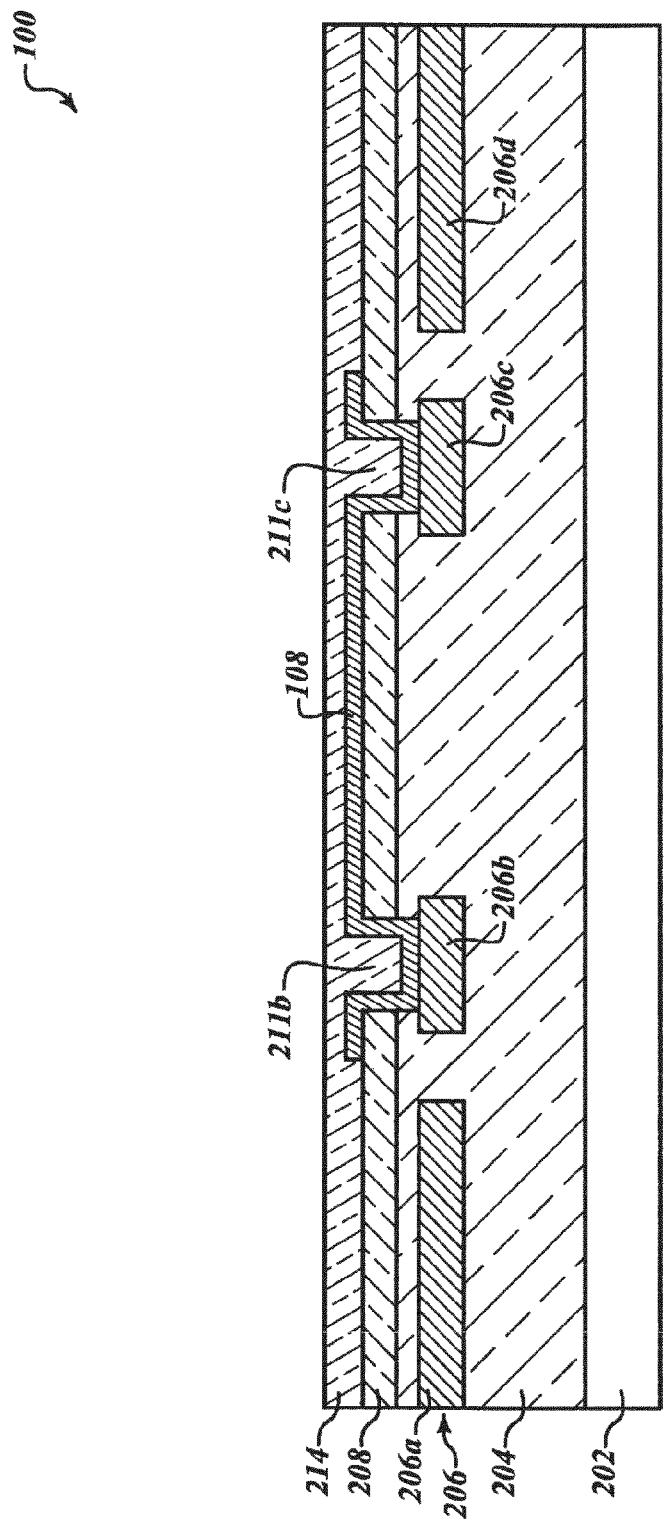

In FIG. 5, photoresist 210 of FIG. 4 has been removed, and a thin film thermal separator 214 has been deposited adjacent to resistor 108. Thin film thermal separator 214 has properties of both a thermal conductor and an electrical insulator. While thin film thermal separator 214 will usually be deposited using a thin film process, in one embodiment thin film thermal separator 214 is an air void. In another embodiment thin film thermal separator 214 is $Si_3N_4$ having a thermal conductivity of approximately 20 W/m/K. In another embodiment thin film thermal separator 214 comprises silicon carbide, $Si_xC_{1-x}$ having a thermal conductivity of approximately 150 W/m/K. Silicon carbide has the property of being hard, very stable and resistant to cracking over wide temperature ranges. The layer 214 is selected to be one that is an electrical insulator and has acceptable thermal properties, namely, it is highly stable and resistant to cracking over a wide range of temperatures, also, it has a thermal coefficient of expansion in a range to match the surrounding layers so it will not cause stress on the resistor 108 or heater 106 as the temperature changes. $Si_3N_4$ and SiC are two acceptable materials. Additionally, thin film thermal separator 214 has a high breakdown voltage, allowing it to withstand a high voltage potential between resistor 108 and the heater 106 to be described in correspondence with FIG. 7.

Figure 6:
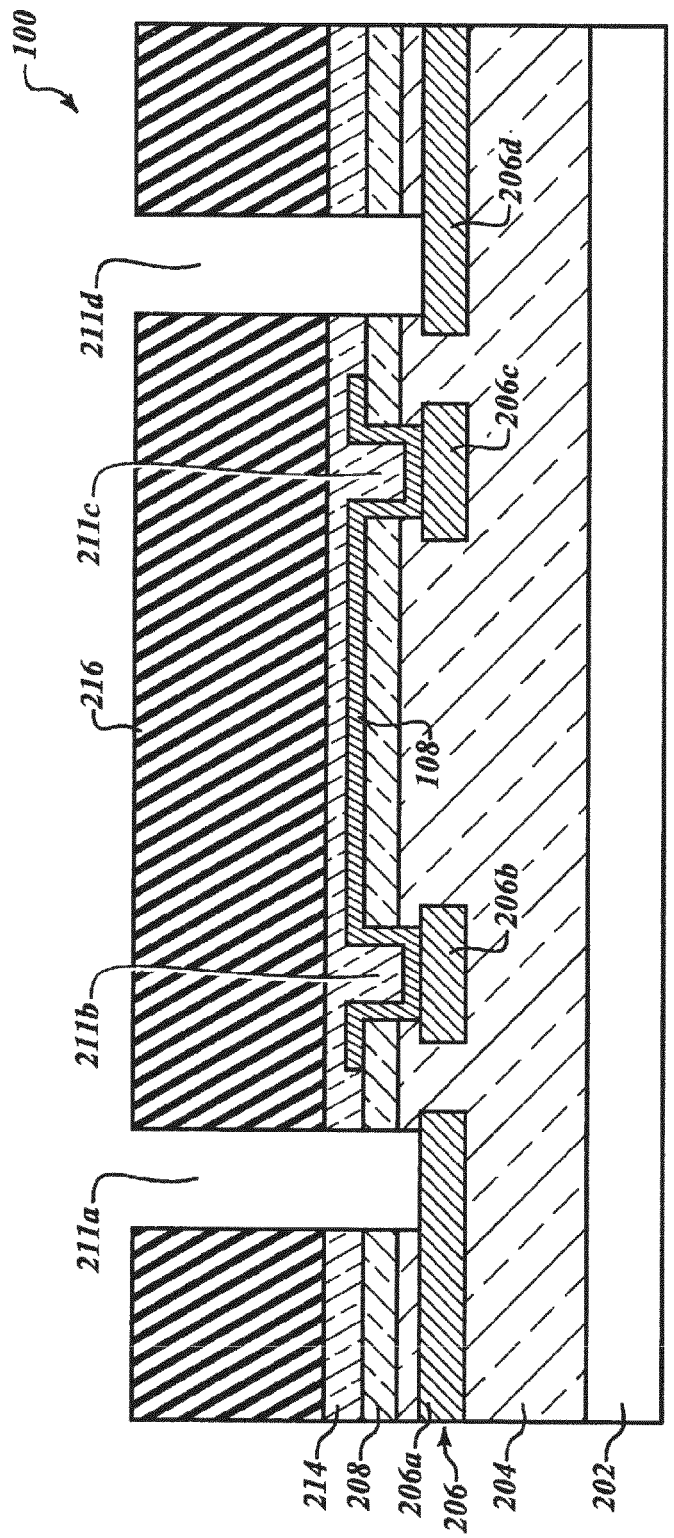

FIG. 6 shows the use of photoresist 216, a temporary layer, within trimming system 100 to create via 211a and via 211d in thin film thermal separator 214, layer 208, and insulator 204. The vias extend to and expose metal layer 206a and 206d. By exposing metal layer 206a and 206d, the next conductive layer will be electrically coupled to metal layer 206a and 206d while still electrically insulated from resistor 108 by means of intervening layers thin film thermal separator 214, layer 208, and insulator 204.

Figure 7:
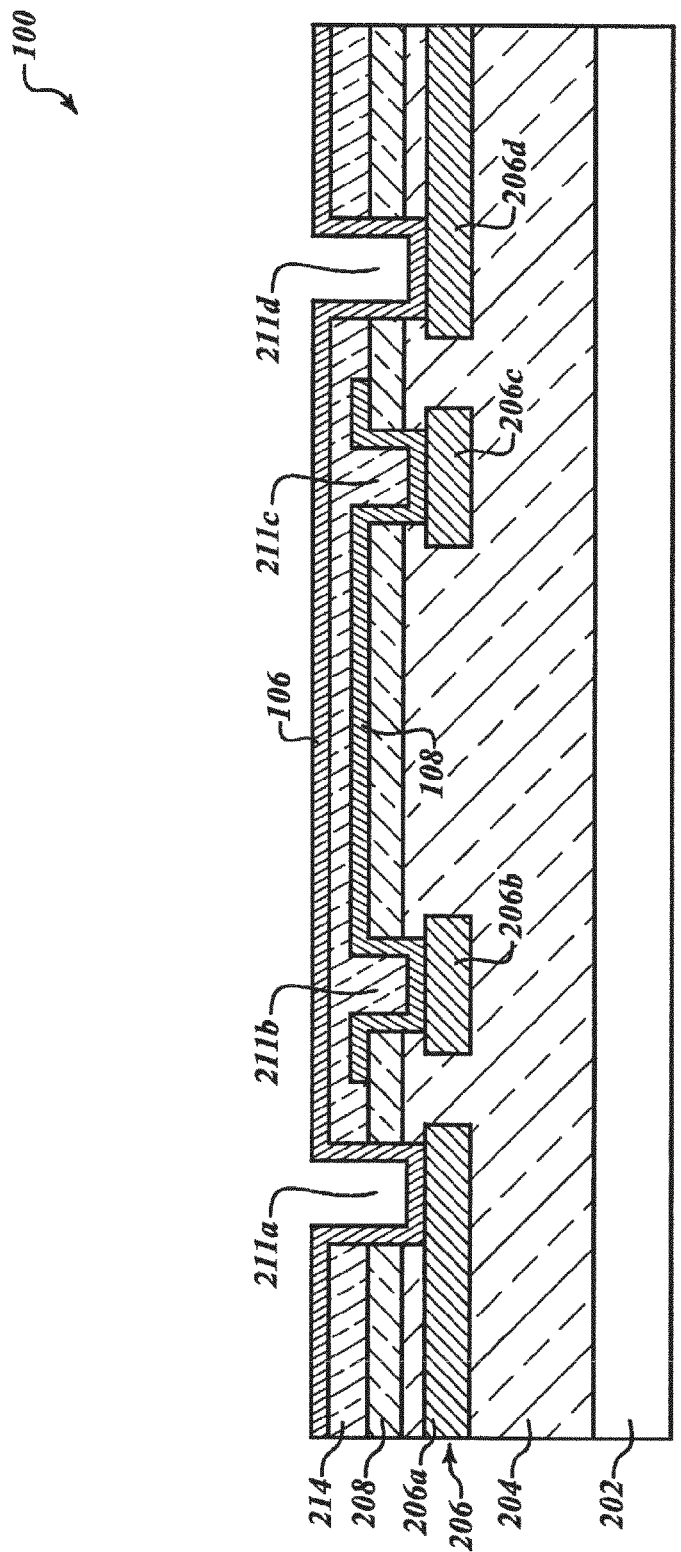

FIG. 7 shows a deposition of a layer to form heater 106 of FIG. 1. Heater layer 106 corresponds to heater 106 of FIG. 1. In one embodiment, heater 106 is deposited over thin film thermal separator 214 via a thin film process. Heater 106 is connected to metal layer 206a and 206d. Heater 106 has heat generating properties determined by its composition, length, width, and depth. In one embodiment, heater 106 is a thin film resistor. In another embodiment, heater 106 comprises TaSiN having a sheet resistance of approximately 100 ohms/sq. Heater 106 comprises a material that can withstand high intensity heat without structural damage. Since some heat transferred from heater 106 to resistor 108 will be dissipated and lost in thin film thermal separator 214, heater 106 needs to be able to exceed beyond 850° C. to bring resistor 108 to that temperature. Finally, heater 106 may contain the following properties: low temperature coefficient of resistance, low noise, high linearity resistance, and integration density for radio frequency devices.

Figure 8:
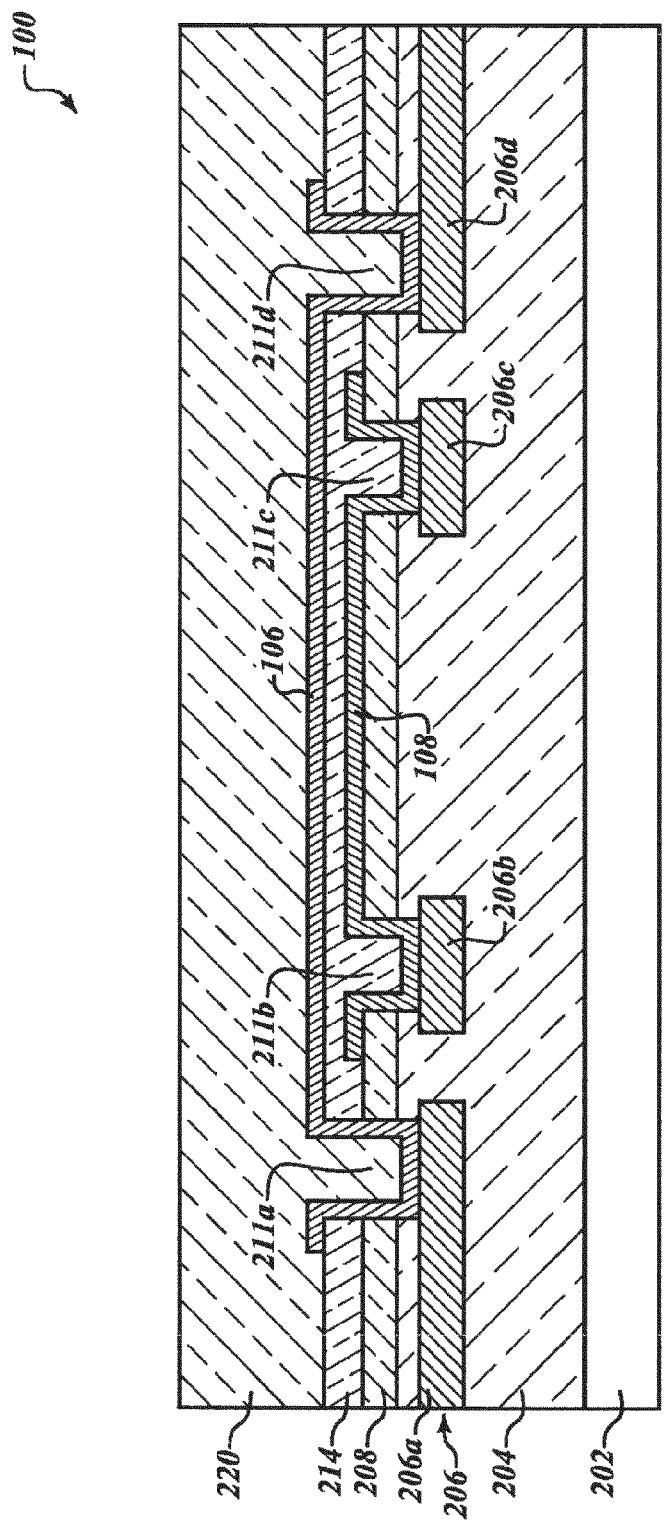
Figure 9:
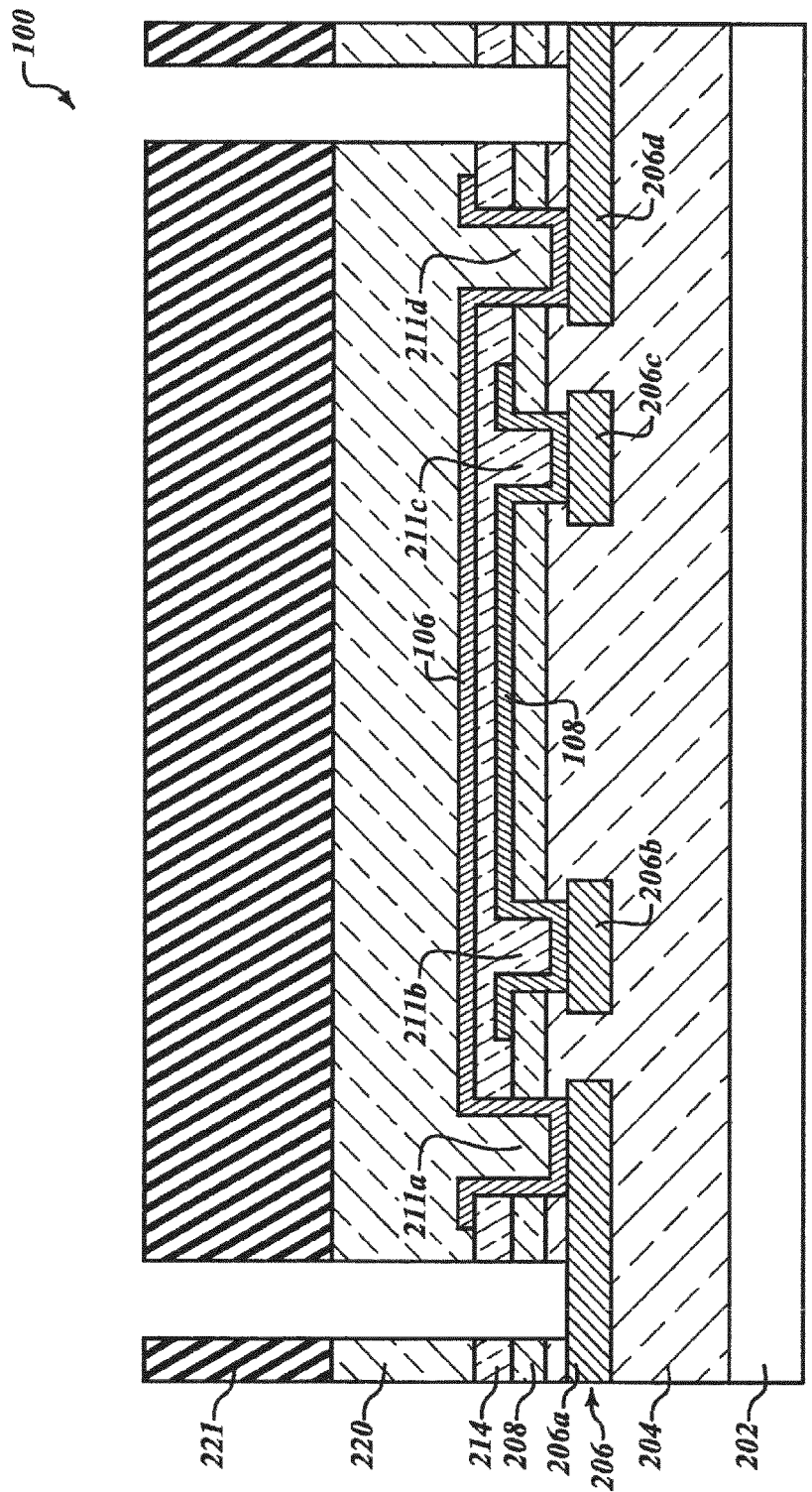
Figure 10:
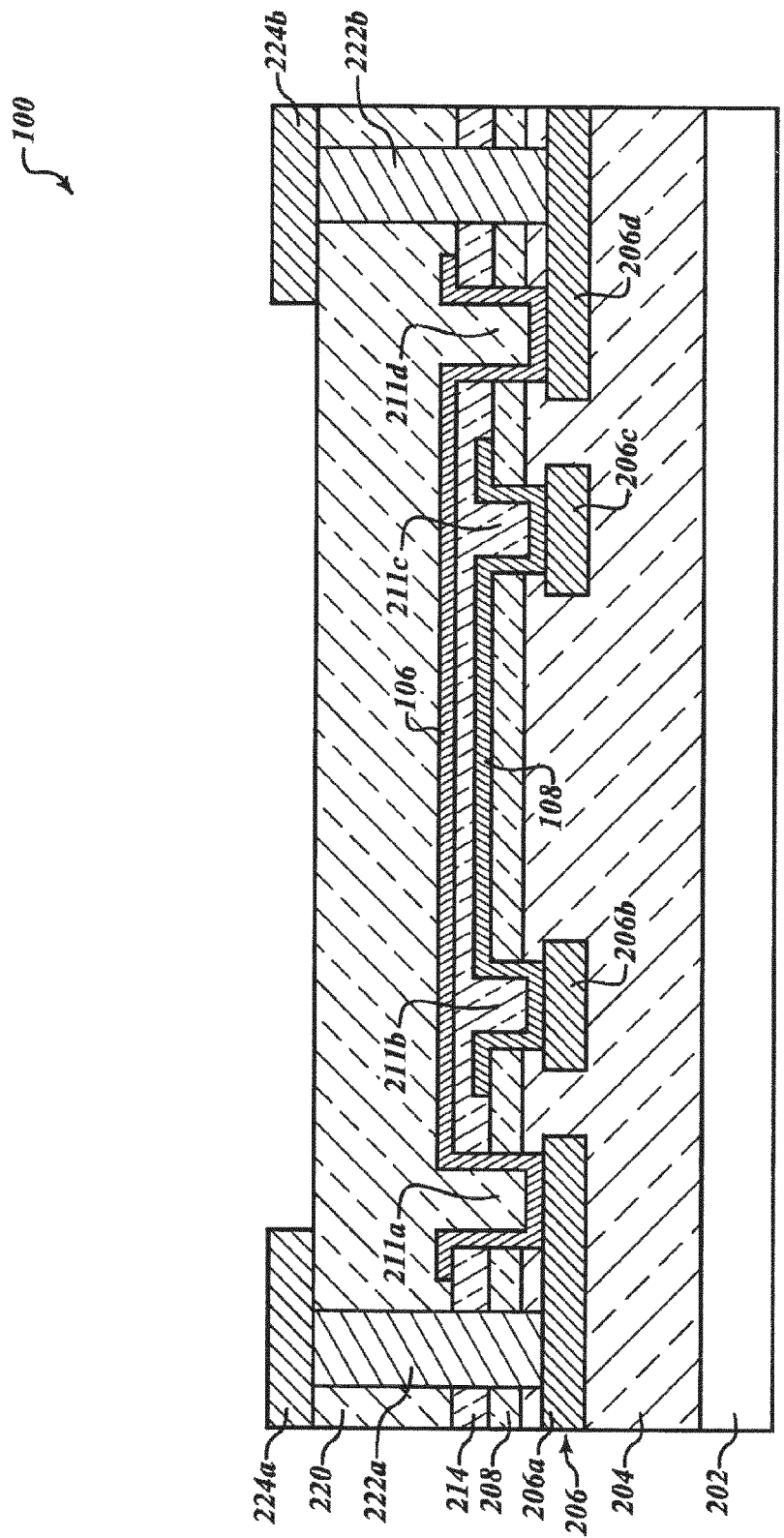
Figure 11:
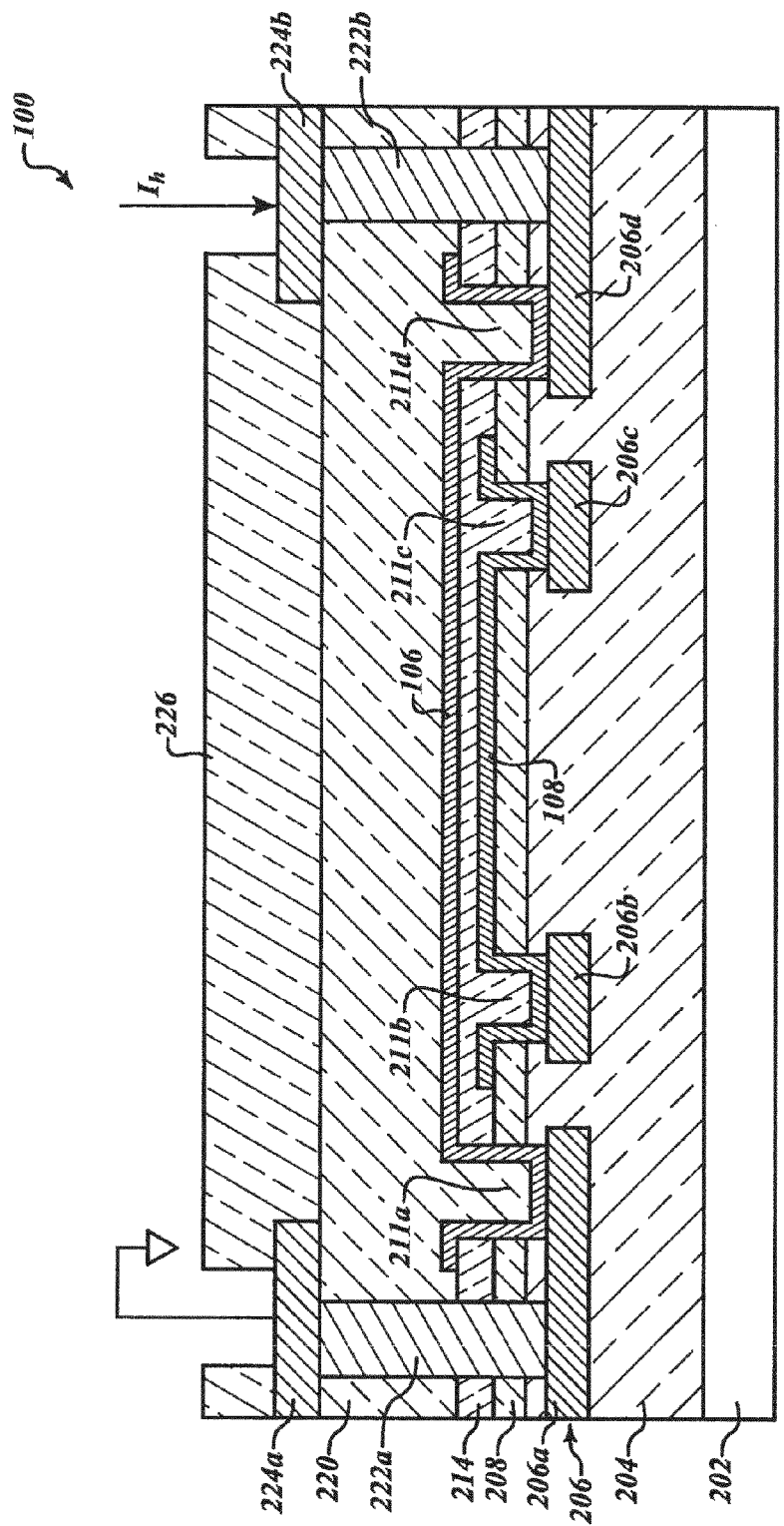

FIG. 8 through FIG. 11 show the process of connecting another metal layer to heater 106. FIG. 8 shows dielectric 220 disposed adjacent heater 106. FIG. 9 shows via openings to metal layer 206a and 206d through use of a pattern in photoresist 221. FIG. 10 shows plug 222a and 222b inserted into the via openings of FIG. 9. FIG. 10 also shows the deposition of metal layer 224a and 224b after a photoresist has been patterned, etched, and removed. Metal layer 224a is deposited onto plug 222a and metal layer 224b onto plug 222b. The physical connection of metal layer 224 to plug 222 to metal layer 206 provides a low resistance path for current to flow to heater 106. As shown, heater 106 shares an electrical connection with plug 222 to metal layer 206. FIG. 11 shows openings in upper layer 226. In one embodiment metal layer 224 is the top-most metal layer and upper layer 226 is a passivation layer. In this embodiment metal layer 224a may be connected to ground and metal layer 224b may be connected to receive current flow $I_h$. It is to be understood, however, that heater 106 is bi-directional and is not to be limited to only having current flow in the direction illustrated in FIG. 11. In another embodiment, upper layer 226 is another inter-metal layer insulator or dielectric upon with another metal layer may be deposited.

The distance between heater 106 and resistor 108 serves several functions. First, the distance acts to provide electrical isolation between the electrical elements. Electrical isolation between the elements allows one or both of heater 106 and resistor 108 to be independently used as a loading resistor or other circuit element such as a thermal sensor. Second, the distance controls the heat transfer characteristics of the trimming system. The smaller the distance between heater 106 and resistor 108, the more easily heat is transferred between the devices. Lastly, two conductors separated by a dielectric form a capacitive element. In FIG. 11, heater 106 forms a first plate, resistor 108 forms a second plate and thermal separator 214 forms a dielectric between the two conductors. The capacitance of the combination of these three elements is governed generally by the equation:

$$C = k \times A/d,$$

where

C = the capacitance, the ability of conductors separated by a dielectric to hold a charge;

k = the dielectric constant;

A = the area of overlap between the conductors; and d = the distance between the conductors.

Thus, the distance between heater 106 and resistor 108 also serves the purpose of inversely controlling the capacitance between the two elements. In one embodiment, connections to heater 106 and resistor 108 are configured to use the two conductive layers and the thin film thermal separator 214 as a capacitor.

Figure 12:
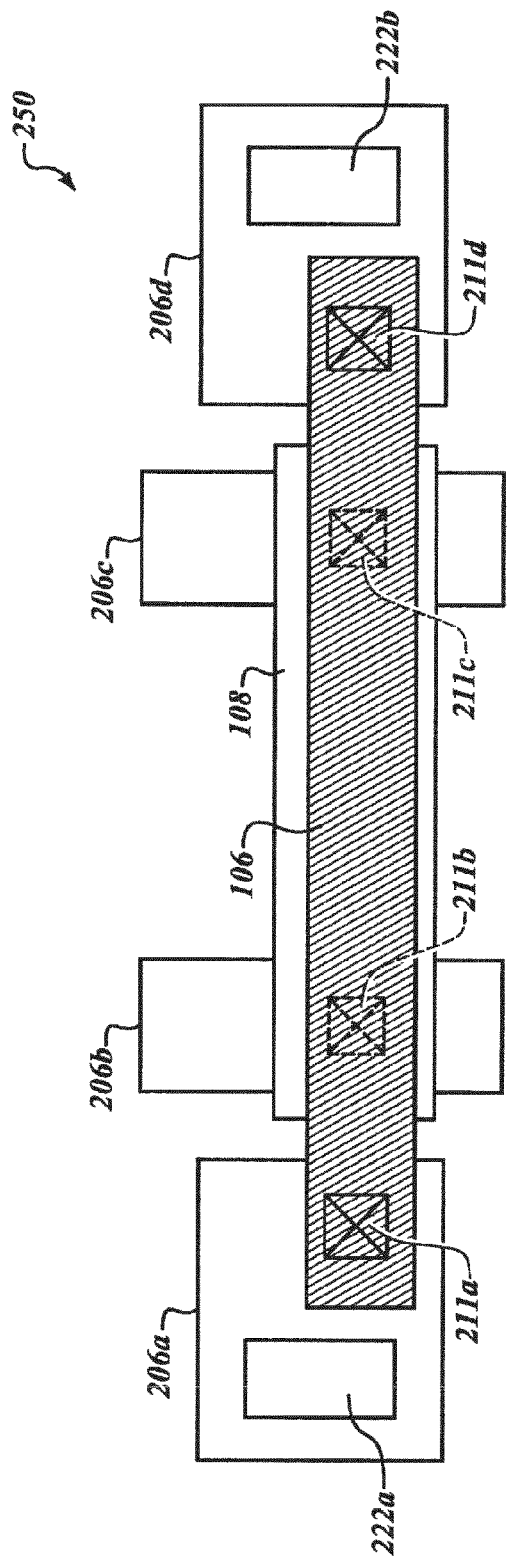
FIG. 12 is a partial-layer top view of the heater and trimmable resistor, in accordance with an embodiment of the invention.

FIG. 12 shows a partial top view of trimming system 100. As shown, heater 106 extends over and along the length of resistor 108. Via connections 211a through 211d illustrate electrical connections between heater 106 and metal layer 206a and 206d as well as connections between resistor 108 and metal layer 206b and 206c. Here, heater 106 is also shown disposed on top of resistor 108. Variations on this orientation may be made that are equivalent, these include: heater 106 being shorter than resistor 108, heater 106 being the same width as or wider than resistor 108, heater 106 being disposed beneath resistor 108, heater 106 being disposed to a side of resistor 108, or heater 106 overlapping only portions of resistor 108.

Figure 13:
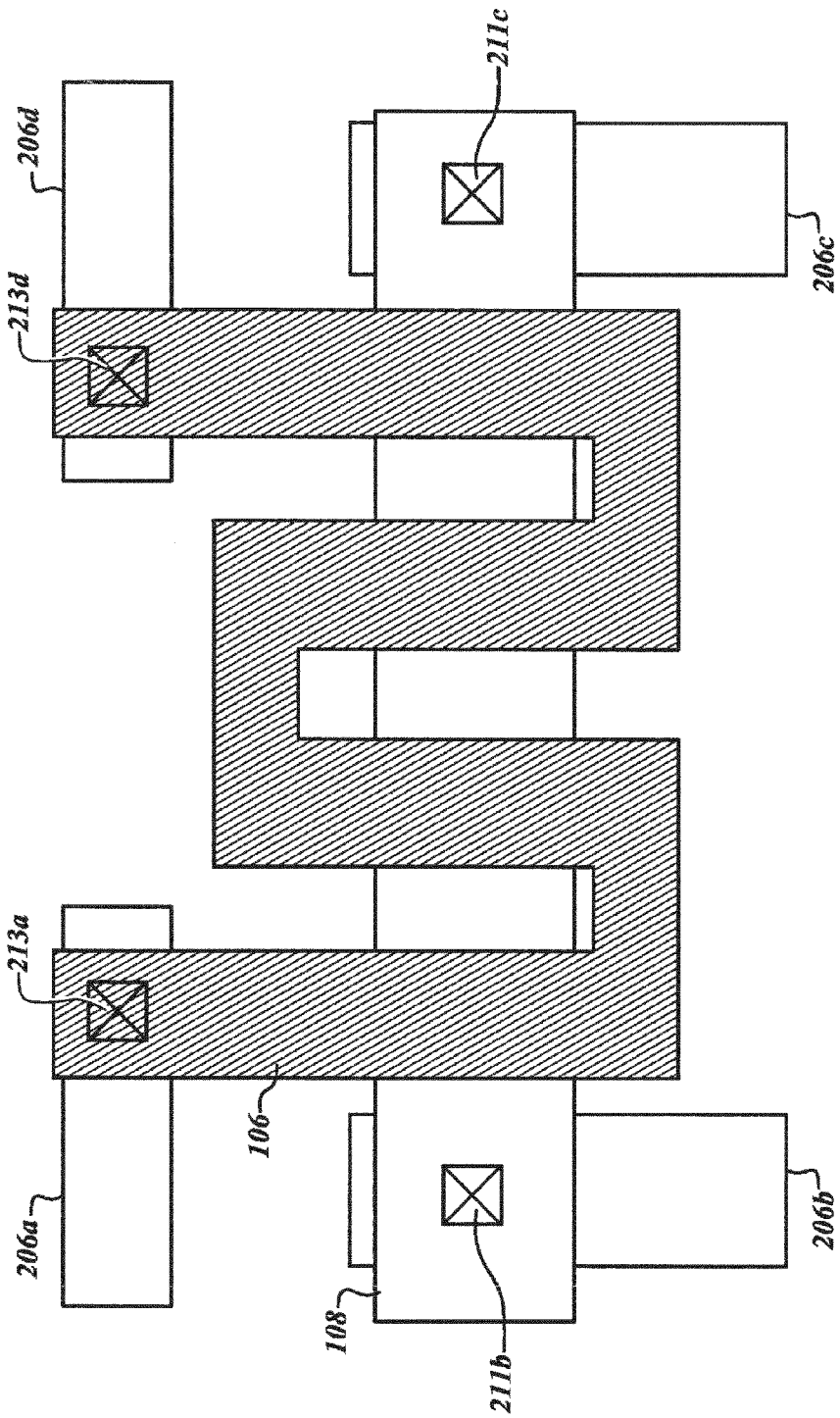
FIG. 13 is a partial-layer top view of the heater and trimmable resistor, in accordance with another embodiment of the invention.

FIG. 13 is an example of one embodiment of a top view of FIG. 12 showing the orientation of heater 106 and resistor 108. FIG. 13 shows heater 106 crossing back and forth over resistor 108 in a serpentine shape. Via connections 213a and 213d illustrate electrical connections between heater 106 and metal layer 206a and 206d, and via connections 211b and 211c illustrate connections between resistor 108 and metal layer 206b and 206c. The duration or number of exposures of resistor 108 to heat will vary depending upon the shape of the heater 106. Other shapes may be implemented that are equivalent to perform the function of heating resistor 108 with heater 106 to a temperature sufficient to permanently vary the resistance of resistor 108.

Figure 14:
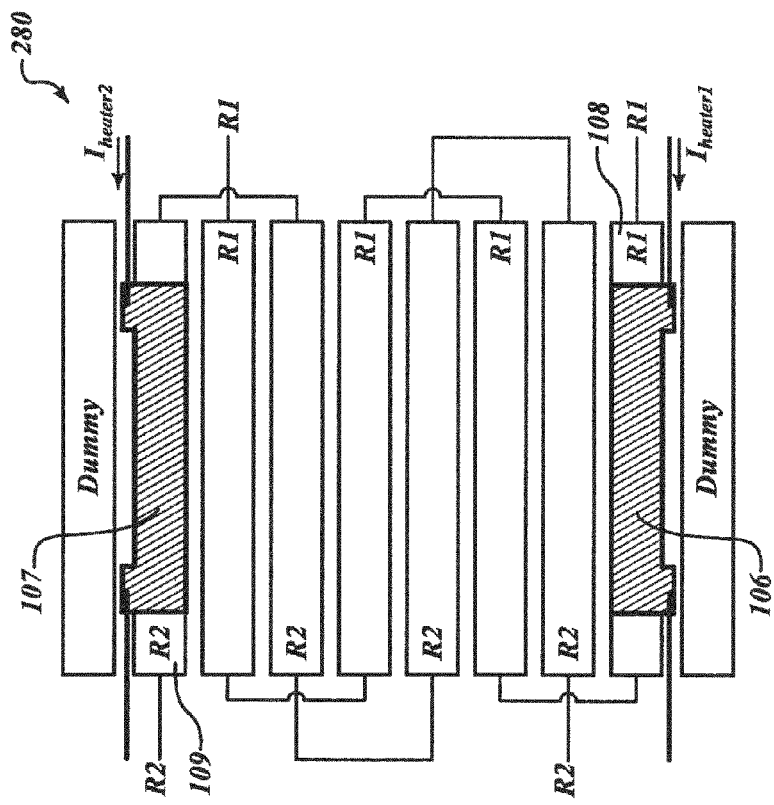
FIG. 14 is a layout view of a pair of trimmable resistors and resistor heaters, in accordance with an embodiment of the invention.

FIG. 14 shows interdigitated layout 280 illustrating an embodiment of the current invention. Resistive network 280 includes resistor 108, resistor 109, heater 106, heater 107, and dummy resistor cells. Dummy resistor cells are placed on either end of the interdigitated resistors to assist with better resistor matching. They can be used as test sites to test the actual value of the resistor before trimming so that the trimming will have an accurate starting point. They will have appropriate connection lines so that their resistance can be measured from terminals or contact pads outside of the die or in a packaged chip. In this embodiment only one cell of each of resistor 108 and resistor 109 is overlapped by a heater. This embodiment has the effect of an even more precise fine tuning because three-fourths of resistors 108 and 109 will be largely unaffected by the application of $I_{heater1}$ to heater 106 or $I_{heater2}$ to heater 107. In another embodiment, more or less of a single cell of resistors 108 and 109 is overlapped by heaters 106 and 107 to affect the precision of trimming the resistor. In yet another embodiment, more cells of resistor 108 or resistor 109 are overlapped by heater 106 or heater 107 to increase the influence of each heater on the sheet resistance, and therefore overall resistance, of the resistors. Generally, resistor fabrication recipes can be considered an estimate or course trim of the final values of resistors 108 and 109, and using heaters 106 and 107 to change the resistance of resistors 108 and 109 can be considered a fine or precision trim of the final values of the resistors.

Figure 19:
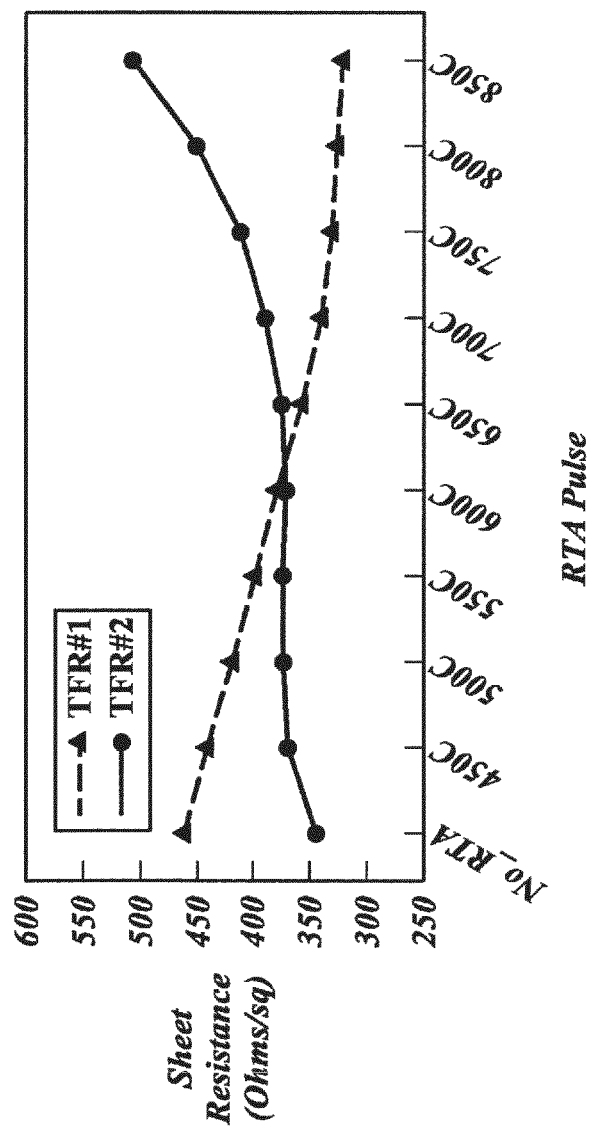
FIG. 19 is a chart illustrating how the sheet resistance of a trimmable resistor may permanently change with temperature, in accordance with an embodiment of the invention.

In one embodiment, resistor 108 is a type of resistor which increases its resistance value when heated, and resistor 109 is a type of resistor which decreases its resistance value when heated. Accordingly, a user or maker can use a fuse to connect either resistor 108 or resistor 109 into the circuit to increase the resistance by utilizing heater 106 or to decrease the resistance by utilizing heater 107. FIG. 19 illustrates how two resistors, each having an initial sheet resistance of 1 kohm/sq, may react to the 450° C. to 850° C. temperature range, in accordance with an embodiment of the invention. In one embodiment resistor 108 and resistor 109 are connected in series and are used to represent a single resistor, such as $R_{sense}$ or R1 of FIG. 17. In one embodiment, resistor 108 and resistor 109 are connected in parallel and used to represent a single resistor, such as $R_{sense}$ or R1 of FIG. 17. In these embodiments, no fuse is used, rather both resistor 108 and resistor 109 are in series (or parallel) to provide the target resistance. Each is made of a different material and has one or more segments. If it is desired to increase the resistance, then resistor 108 is heated and if it is desired to decrease the resistance, then resistor 109 is heated.

Figure 15:
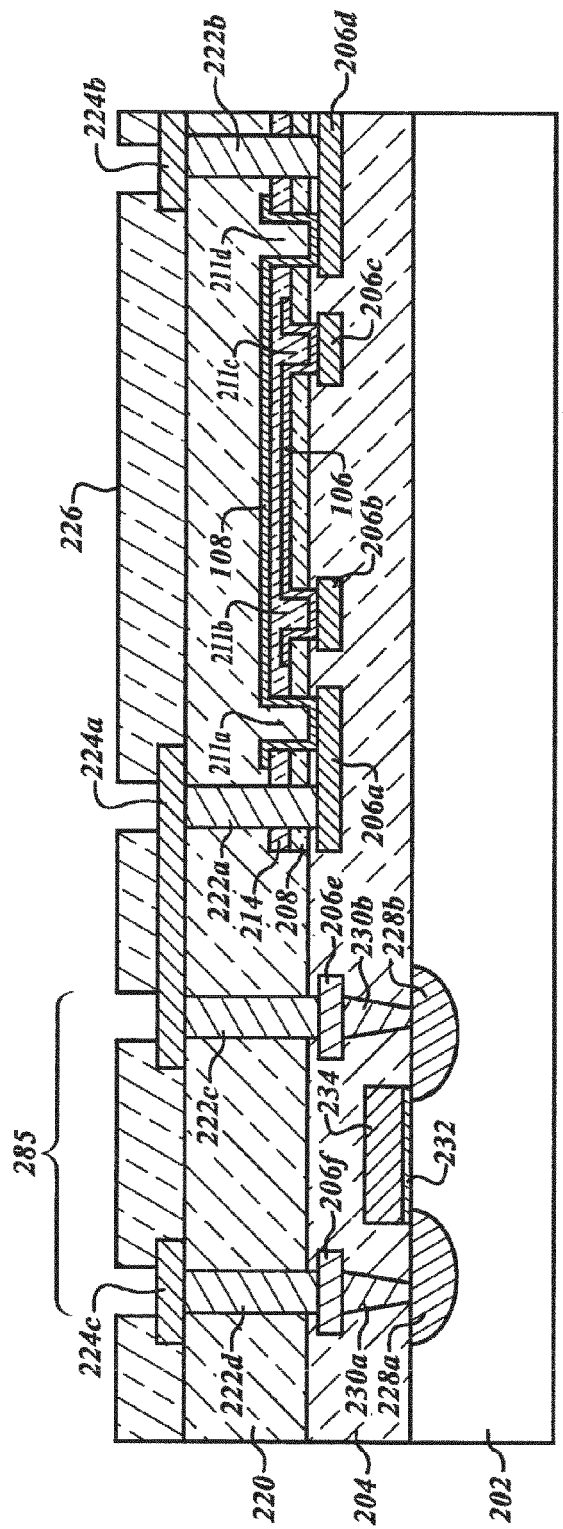
FIG. 15 is a cross-sectional view of various layers of the heater, the trimmable resistor, and a transistor, in accordance with an embodiment of the invention.

FIG. 15 is a depiction of trimming system 100 as it may be coupled to a nearby device. FIG. 15 shows trimming system 100 coupled to a transistor 285. Transistor 285 includes a source 228a, a drain 228b, a contact 230, an oxide layer 232, and a gate 234. The transistor 285 may correspond to the switch 104 or it may be one transistor in the circuit, such as with an op amp, as shown in FIG. 15.

FIG. 15 exemplifies how resistor 108 (now on top of heater 106), might be connected to additional devices. Metal layer 224a couples plug 222a with plug 222c. Plug 222c is adjacent to metal layer 206e. Metal layer 206e is adjacent to contact 230b which attaches to drain 228b. Oxide layer 232 is under gate 234 and is above drain 228b and source 228a. The gate is also connected to metal with a contact and via plug, but these elements are not shown in this figure. Source 228a is connected to contact 230a. Contact 230a is adjacent to metal layer 206f which is adjacent to plug 222d. Plug 222d is also adjacently connected to metal layer 224c. Metal layer 224c may be connected to another device or circuit through a lateral extension of metal layer 224c, as shown in 224a, or it may be electrically connected by wire-bonding or a series of additional plugs and metal layers. As will be appreciated by one of ordinary skill in the art, transistor 285 formed with gate 234 is just an example of a device that may be coupled to resistor 108, hence this example is not to be interpreted as the only configuration available.

FIG. 16 shows an amplifier circuit 300 using a trimmable resistor in accordance with an embodiment of this invention. Amplifier circuit 300 exemplifies the proportional influence a trimmable resistor may have on the gain of a circuit. Amplifier circuit 300 includes an input signal $V_{in}$, a resistor 304, an operational amplifier ("op amp") 306, an output voltage $V_{out}$, a trimmable resistor 310, a heater 312, circuitry 316, a transistor 318, and a heater control signal $V_{hcs}$.

As has been described previously, heater 312 selectively receives a current I from transistor 318 which is controlled by heater control signal $V_{hcs}$. In one embodiment heater control signal $V_{hcs}$ is a single pulse. In another embodiment, heater control signal $V_{hcs}$ is a series of pulses that can be applied from an outside terminal or controlled by a computer program. The computer program is stored in a computer-readable medium such as a disk, a memory, or the like. Circuitry 316 represents additional circuit elements that may be placed between transistor 318 and heater 312. In one embodiment, circuitry 316 is merely a straight line conductor. In another embodiment circuitry 312 includes additional transistors for current control or voltage regulation. Heater 312 selectively increases in temperature in response to current $I_{heat}$ flowing from transistor 318. The heat from heater 312 is transferred through a dielectric, like air or $SiO_2$, to permanently change the resistance of trimmable resistor 310.

Trimmable resistor 310, also labeled $R_{fb}$, is part of an inverting amplifier configuration. The output of op amp 306 is fed back to the inverting input of op amp 306. The feedback configuration of $R_{fb}$ proportionally affects output voltage $V_{out}$ as follows:

$$V_{out}=-V_{in} \times R_{fb}/R1.$$

Thus, changes in $R_{fb}$ or variations in $R_{fb}$ from its designed value proportionally affect the gain of the circuit. The ability to permanently modify the value of $R_{fb}$ at any time after the fabrication process so that the resistance aligns more closely with the desired value can greatly tighten tolerances and improve performance of circuit implementations.

Figure 17A:
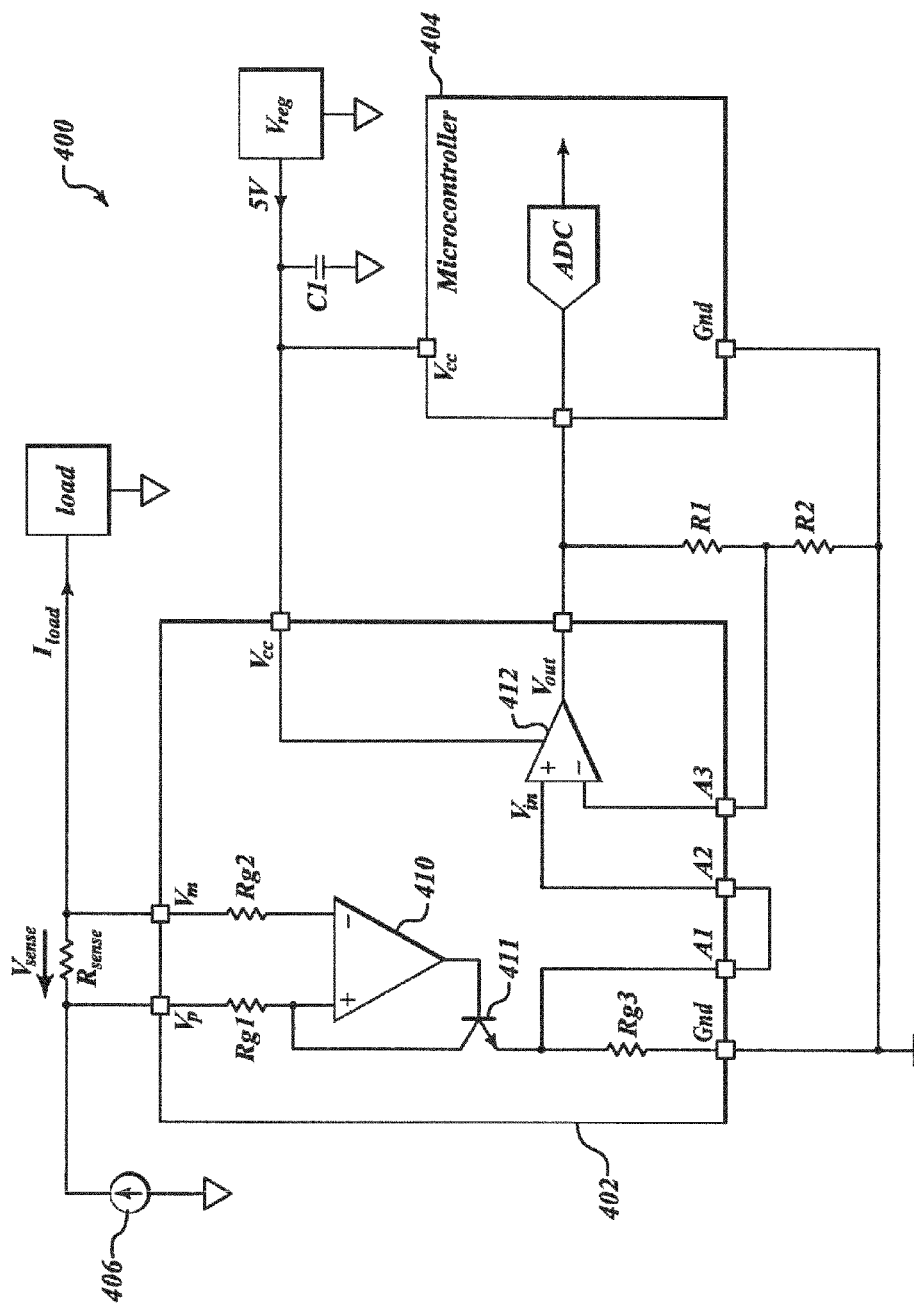
FIGS. 17A and 17B are circuit diagrams illustrating an integrated circuit using the trimmable resistor, in accordance with an embodiment of the invention.

FIG. 17A exemplifies additional uses of a trimmable resistor in accordance with an embodiment of the present invention as used in integrated circuit ("IC") system 400. IC system 400 shows an IC sense amp 402 connected to provide an output signal to an IC microprocessor 404. IC system 400 also includes circuitry external to IC sense amp 402 and IC microprocessor 404, such as a current source 406, a shunt resistor Rsense, a load, a voltage regulator Vreg, a decoupling capacitor C1, gain resistors R1 and R2, and a connection to ground.

IC sense amp 402 receives an input at $V_p$ (voltage plus) and $V_m$ (voltage minus) terminals and, in this configuration, produces an output on the Out terminal of IC sense amp 402. Current source 406 forces a current through shunt resistor Rsense to the load. As a result of the current flowing from current source 406, electric potential $V_{sense}$ develops across the terminals of shunt resistor $R_{sense}$. Electric potential $V_{sense}$ is passed through resistors Rg1 and Rg2 to the corresponding + and − inputs of op amp 410. The difference in electrical potential across inputs + and − of op amp 410 is proportionally increased by the gain of op amp 410 and transferred to the base of transistor 411. Assuming Rg1, Rg2, and Rg3 are equal, a voltage proportional to $V_{sense}$ will be transmitted via transistor 411 and resistor Rg3 to Vin, the + input of op amp 412.

Op Amp 412 is configured to be a non-inverting amplifier. The relationship between Out, $V_{in}$, R1, and R2 is:

$$Out=V_{in} \times (1+R2/R1)=V_{in} \times (R2+R1)/R1.$$

Thus, the Out terminal of IC sense amp 402 is proportional to $V_{in}$ as well as to the sum of R2 and R1. It should be noted that when R1 is significantly larger than R2 then the non-inverting amplifier configuration of op amp 412 resembles a follower (Out≈$V_{in}$).

In one embodiment, $R_{sense}$ is a thin film trimmable resistor which has a resistance that can be increased or decreased in accordance with an embodiment of the present invention.

In another embodiment, one or more of the resistors described in IC system 400 are implemented with thin film trimmable resistors which have resistances that can be selectively increased or decreased in accordance with an embodiment of the present invention.

In another embodiment, IC sense amp 402 is a high sense amp which can be used as a high voltage capacitance filter to make it robust in an electromagnetic environment. It can also be used to provide CEM protection because high voltage capacitances have ultra low density.

Figure 17B:
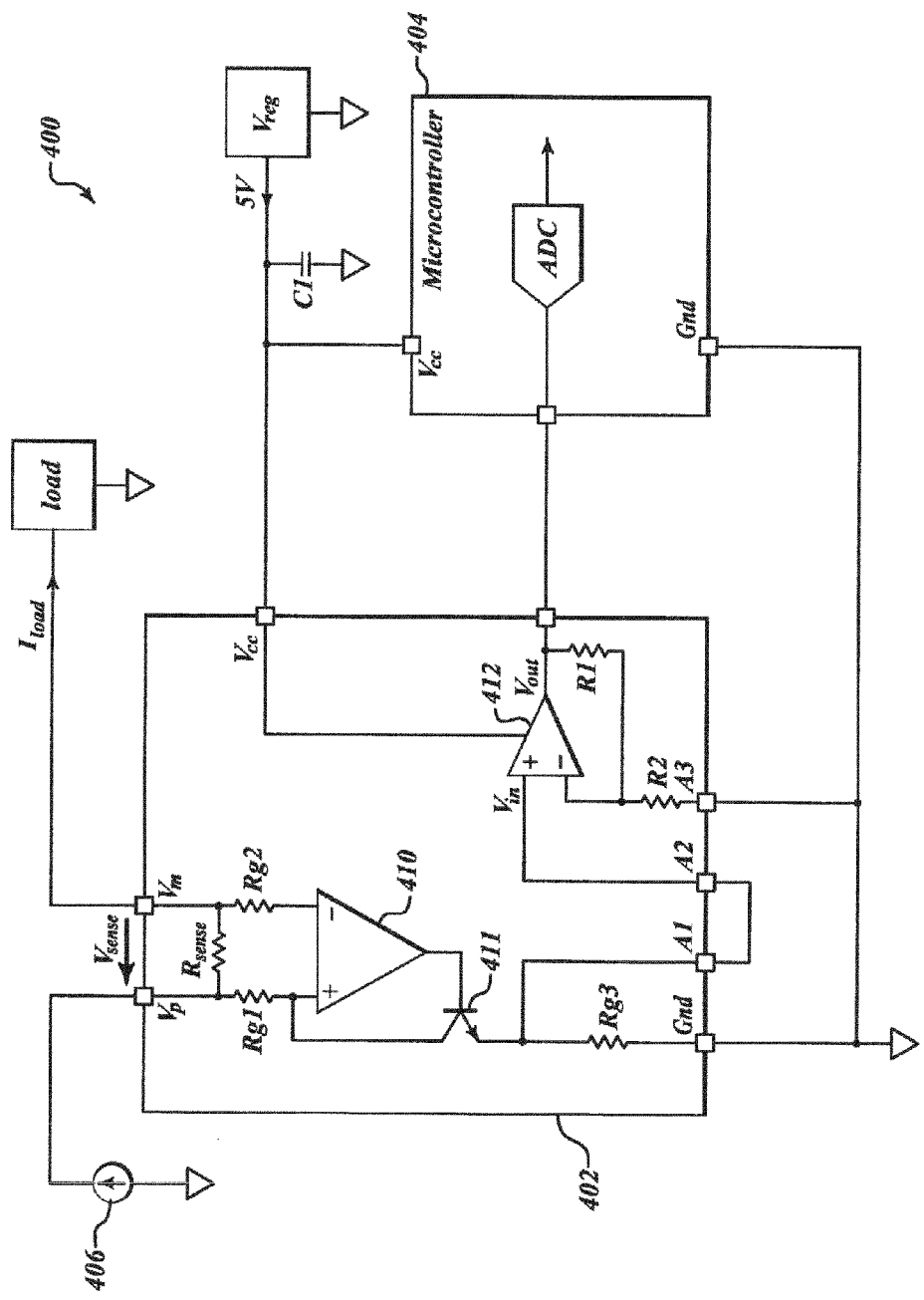

FIG. 17B illustrates IC system 400 having the features of FIG. 17A in addition to having $R_{sense}$, R1, and R2 internal to integrated circuit 402. Previously, a precision resistor such as $R_{sense}$ had to be an external resistor because resistor tolerances on integrated circuits tend to vary widely. Since it was very difficult to manufacture precision resistances to an exact value within tight tolerances in integrated circuits, until this invention, $R_{sense}$ was required to be an external resistor.

$R_{sense}$ had to be an external resistance for two reasons. First a user had to choose the needed value within a tolerance, and second, the user had to choose a course value that would interact appropriately with a large or small load. However, in accordance with this invention we have the advantage of being able to have $R_{sense}$ be part of the integrated circuit. $R_{sense}$ no longer has to be a component external to the integrated circuit requiring a user to purchase and assemble additional components. The user now has the ability to select the value of $R_{sense}$ to achieve both a higher or lower resistance as well as trim it to a precise value of the resistance. Accordingly, what used to be a time consuming and expensive process of purchasing the correct resistor and connecting it into a circuit design is no longer necessary. The key resistor, $R_{sense}$ is now included in silicon on the integrated circuit. The user can now just program the value of $R_{sense}$ based on the desired end use. In one embodiment each of $R_{sense}$, R1, and R2 are all integrated into the same integrated circuit die and are trimmable in accordance with an embodiment of the present invention. Any of the resistances, including any of the internal resistances Rg1, Rg2, and Rg3 can be trimmable using the techniques of this invention. Accordingly, the user will now have the ability to customize the circuit by choosing the precise desired resistances in accordance with the desired end use, thus saving considerable money, time, and having a better performing and higher quality end product.

FIGS. 18A-18C illustrate different steps that may occur in methods for trimming a resistor 500, in accordance with an embodiment of the present invention. This method will be discussed in the context of trimming system 100 of FIG. 1.

However, it is to be understood that the steps disclosed herein may be varied in accordance with other embodiments of the invention.

Each of the methods of trimming described herein, including those shown in FIGS. 18A-18C, can be carried out at various stages during the manufacturing process. In a first embodiment, they are carried out at the wafer test stage as performed by the manufacturer. In alternative embodiments, the wafer trimming steps can be carried out after the wafer has been diced and the individual dies are being tested during packaging. The invention has particular advantages when used in a package chip. For high precision circuits, it has been found that packaging sometimes induces parameter shift and precision loss. In addition, packaging can have effects on various components in the circuit, slightly modifying the performance of different transistors, amplifier circuits, and different structures, once the chip is fully packaged. This may be for various reasons, including the conditions which the die encounters during packaging, and also because of the electrical connection changes which take place when the die is placed inside a package, ball bonded to a lead frame, and then connected to terminals outside the package. It has been found that in some example circuits having standard amplifiers, audio amplifiers, high speed circuits, and current sensing, that the packaging steps provide sufficient modification to the circuit that resistor trimming is sometimes best performed after the packaging has been completed. Accordingly, according to one embodiment, the resistor trimming steps shown in FIGS. 18A-18C are carried out after the packaging has been completed.

As described herein, all of the acts comprising the method may be orchestrated by a manufacturing processor or controller based at least in part on execution of computer-readable instructions stored on a disk or in memory. In other embodiments, a hardware implementation of all or some of the acts of the manufacturing method may be used.

FIG. 18A is a flowchart illustrating an embodiment of a method of trimming a resistor. Generally, the embodiment of FIG. 18A relates to a method of trimming a resistor having a known value while a more desirable end value of the resistor is sought. One seeking to implement this method would typically understand the characteristics of the resistor being trimmed. That is, to change the resistance of the resistor by some desired number of ohms or ohms/sq, the temperature and duration of the temperature of resistor exposure should already be known. In one embodiment, a chart, table, database, or the like is used to determine how long resistor 108 must be exposed to a certain temperature to effect the desired change. Hence, FIG. 18A illustrates a system without feedback while trimming a resistor where the current value is known, a new value is desired, and a temperature and duration are chosen to cause the value of the resistance to change from the current value to the new desired value.

In step 505, the resistance of resistor 108 is determined. This can be performed by many methods, including: directly measuring resistor 108 with a voltmeter; measuring a circuit containing resistor 108 and calculating the resistance based upon the values of interrelated circuit elements; or measuring a similarly composed material deposited in a wafer scribe line, deposited in a corner of an individual die, or the like. In one embodiment, a test structure made of exactly the same layer as the resistor is made at a location on the wafer that can be easily probed. For example, if the resistor to be trimmed is made in polysilicon, a relatively large strip of polysilicon located in the scribe line or at a testable location can be formed at the same time, using the same process steps as the resistors in the circuit. The actual resistor itself cannot be tested, but the sheet resistance of the corresponding structure in the scribe line can be tested and the exact value of the resistance, as formed can thus be known. The amount of change needed in the resistance to achieve the target performance can therefore be known and the value of the resistor can be changed by this amount.

In step 510, switch 104 is selectively pulsed to cause a pulse or series of pulses of current to flow through heater 106 which is adjacent to resistor 108. Current flows through switch 104 because it is coupled to a voltage source $V_h$. To protect heater 106 as well as the dielectric which is separating heater 106 from resistor 108, the current applied to heater 106 will need to be short enough to prevent overheating. The duration of the pulse will depend upon the amplitude of the voltage applied and the resistance of heater 106; however, application of the voltage will resemble a current or voltage pulse. The pulse may take the form of a square wave pulse, a triangle wave pulse, a sinusoidal wave pulse, or the like. The pulse needs to bring heater 106 to a temperature high enough to place resistor 108 in the range of 450° C. and 850° C.

In step 515, heater 106 reaches the desired temperature to cause temperature of resistor 108 to enter the range of 450° C. and 850° C. In one embodiment, a chart, table, database, or the like is used to determine how long resistor 108 must be exposed to a certain temperature to effect the desired change. In one embodiment the resistance of resistor 108 permanently decreases in value as the temperature of resistor 108 increases, as depicted by TFR#1 (thin film heater) of FIG. 19. In another embodiment the resistance of resistor 108 permanently increases in value with temperature increase, as depicted by TFR#2 of FIG. 19. It is noteworthy that the resistance of TRF#2 of FIG. 19 increases by approximately 85% and the resistance of TFR#1 decreases by approximately 25% within the range of 450° C. and 850° C. In one embodiment the initial sheet resistance of the resistors represented by TFR#1 and TFR#2 is 1 kohm/sq. Other materials or longer resistors can be used to cause more changes in the resistance value in order to accommodate a larger range, such as a doubling or tripling of the resistance, or cutting it by half or one-third.

Step 520 shows selectively disconnecting heater 106 from the voltage source after resistor 108 has reached the approximate desired temperature. This method utilizes predetermined temperature and duration data to produce a desired change in the resistance of resistor 108 in a single progression through steps 505, 510, 515, and 520.

FIG. 18B is a flowchart illustrating another embodiment of a method of trimming a resistor. In contrast to the method of FIG. 18A, FIG. 18B illustrates an embodiment of an iterative method of trimming a resistor. Rather than exposing resistor 108 to a particular temperature for a predetermined duration, this embodiment illustrates incrementally approaching a desired final resistance value. This embodiment will, depending upon the increments in resistance per iteration, produce a much more accurate result that the embodiment of FIG. 18A. The cost for the more precise result is the time consumed by iterating between several of the steps discussed below.

In step 505, the resistance of resistor 108 is determined. As discussed, this can be performed by many methods, including: directly measuring resistor 108 with a voltmeter; measuring a circuit containing resistor 108 and calculating the resistance based upon the values of interrelated circuit elements; or measuring a similarly composed material deposited in a wafer scribe line, deposited in a corner of an individual die, or the like.

In step 510, switch 104 is pulsed a single time to cause a pulse of current to flow through heater 106 which is adjacent to resistor 108. Current flows through switch 104 because it is coupled to a voltage source $V_h$. The duration of the pulse will depend upon the amplitude of the voltage applied, the resistance of heater 106, and the desired resolution of incremental changes in resistance. The finer the resolution of the incremental changes, the closer the final value of resistor 108 will be to the desired final value of resistor 108.

In step 517, it is determined whether resistor 108 has reached the desired value of resistance. If the desired value has not yet been reached, then the method would iteratively return to step 505 to determine the resistance of resistor 108, continue to step 510 to pulse switch 104, and return to step 517. If the desired value of resistor 108 had been reached, the method continues to step 520. Additionally, if the desired value of resistor 108 had not been reached, but the resolution of increments is course enough that an additional iteration would result in surpassing the desired value of resistance, then this too would result in progressing to step 520.

Step 520 shows selectively disconnecting heater 106 from the voltage source by discontinuing pulses to switch 104. This step is performed after resistor 108 has reached the desired temperature and resistance value. From here one would restart the process of trimming again only if the circuit, in which the resistor is incorporated, required additional tuning.

FIG. 18C is a flowchart illustrating another embodiment of a method of trimming a resistor. This embodiment includes utilizing the output of integrated circuit 101, into which resistor 108 is incorporated, to determine how much a resistance needs to be adjusted. Unlike the embodiments of both FIGS. 18A and 18B, the initial value of resistor 108, in isolation, is unknown. In many cases access to individual resistors is not available; however access to circuitry output, such as the gain of an amplifier, likely will be available. In such a scenario, the embodiment of FIG. 18C, a performance based trimming method, becomes very useful.

In step 522, circuit 101 is tested to measure its performance. In one embodiment, circuit 101 includes a low-pass or high-pass filter and testing the circuit includes measuring the cutoff frequency. In one embodiment, testing circuit performance includes testing a sense amp with a known current. In another embodiment, circuit 101 includes an amplifier configuration similar to that of FIG. 16. For example, if $R_{fb}$ is initially 4.2 kohms and R1 is 1 kohm, the gain ($V_{out}/V_{in}$) will be −4.2. If however, a gain of −5 is desired the content of step 524 is performed to produce the desired result.

In step 524, the value of resistor 108 that would produce the desired result is calculated. Continuing the example of the configuration of FIG. 16, where resistor 108 is $R_{fb}$ of 4.2 k, one would understand that the value of $R_{fb}$ would need to be increased to 5 kohms to get a desired gain of −5. The user would need access to heater 106 to accomplish the precision trimming of the circuit, but the user would not be required to have direct access to the actual resistor being trimmed, whether to measure or modify. A voltage is provided to selected pins of the package that correspond to the heater. It is not necessary to blow a fuse or provide access to the resistor to trim it, rather, the trimming can be done with standard voltages and connecting normally available package pins to the outside and the resistor can read the desired value using electrical programming on the finished product. This is clearly an advantage over the prior art.

Similarly, the embodiment of FIG. 17B also illustrates the immense utility in trimmable resistors within an IC. Specifically, the gain of op amp 412 is controlled by R1 and R2. A user can measure the output of op amp 412 at $V_{out}$ and make determinations based on the difference between the output measured and the output expected. The user can determine which resistor R1 or R2 to change and how much to change it to produce the designed gain. Additionally, using internal trimmable resistors R1 and R2 saves: space by drastically reducing the size of the overall system, the time consumed in connecting external resistors to the system, and the cost of purchasing additional resistors to add to the system.

Lastly, step 526 includes applying a voltage to heater 106 to cause the previous value of resistor 108, R1, or R2 to change to the calculated value of the resistor, thereby tuning the circuit 101 to perform closer to the target performance. The resistor can have its value changed in step 526 using either the method steps of FIG. 18A or 18B, or other acceptable method.

In one embodiment, the resistors of FIGS. 16 and 17 are implemented as two trimmable resistors in series, where each resistor has its own independent heater. Furthermore, as described with respect to FIG. 14, one of the resistors could have a resistance that increases when heated to a particular temperature and the other resistor in the series could have a resistance that decreases when heated to a particular temperature. Thus, a user would have the option to either increase or decrease the resistance of a resistor comprised of two segments in series which are composed of different resistive materials. It is to be understood that while FIGS. 18A through 18C describe different embodiments of methods by which to test and trim resistor 108, various other methods exist that are not explicitly disclosed here but that adhere to the spirit of these embodiments.

The heat-trimmable resistor may be designed to improve heating efficiency and heating operation of the heat-trimmable resistor 100. Generally, it is desirable to obtain a highest temperature at an active heat-trimmable area of the thin-film resistive material 108 for a given current flow through the heater element 106, and to minimize temperatures in non-active regions of the device. An active region of the heat-trimmable resistor 100 may be defined as a region including at least a portion of the thin-film resistive material 108 in which heat from a proximal heater 106 is intended to alter the resistance of the at least a portion of the thin film resistive material. It may be appreciated that heat generated outside the active area will not be useful, and may contribute to device failure and/or wasted power consumption of the device.

According to some embodiments, a heat-trimmable resistor is designed to incorporate a layer of conductive material that has a sheet resistance $R_s$ of a value significantly lower than the sheet resistance of the heater element 106. The layer of conductive material may connect the heater element 106 to a nearby metal conductor 206, and may be deposited at non-active regions of the a heat-trimmable resistor. The design and layout of the heat-trimmable resistor may be configured to distribute heat from the heater element to an active area of the thin-film resistive material 108 efficiently, and to reduce the distribution of heat to non-active areas of the device. Some device designs may be configured to reduce hot spots that would otherwise occur within the heater. Some designs may also reduce average current density in the heater.

In various embodiments, the heat-trimmable resistor is designed such that heat propagates from an active heating portion of the heater 106 to at least a portion of the resistive material 108 in time intervals on the order of microseconds or a few tens of microseconds. Rapid heat propagation can permit resistive trimming times on the order of a few milliseconds, or less in some embodiments. It will be appreciated that short trimming times are desirable when a large number of resistors may need to be trimmed, e.g., trimming resistance values in a large number of integrated circuits on a process wafer. In some implementations, layout patterns and materials may be selected to obtain heat-trimmable resistors with both high heating efficiency and short trimming times.

Figure 20:
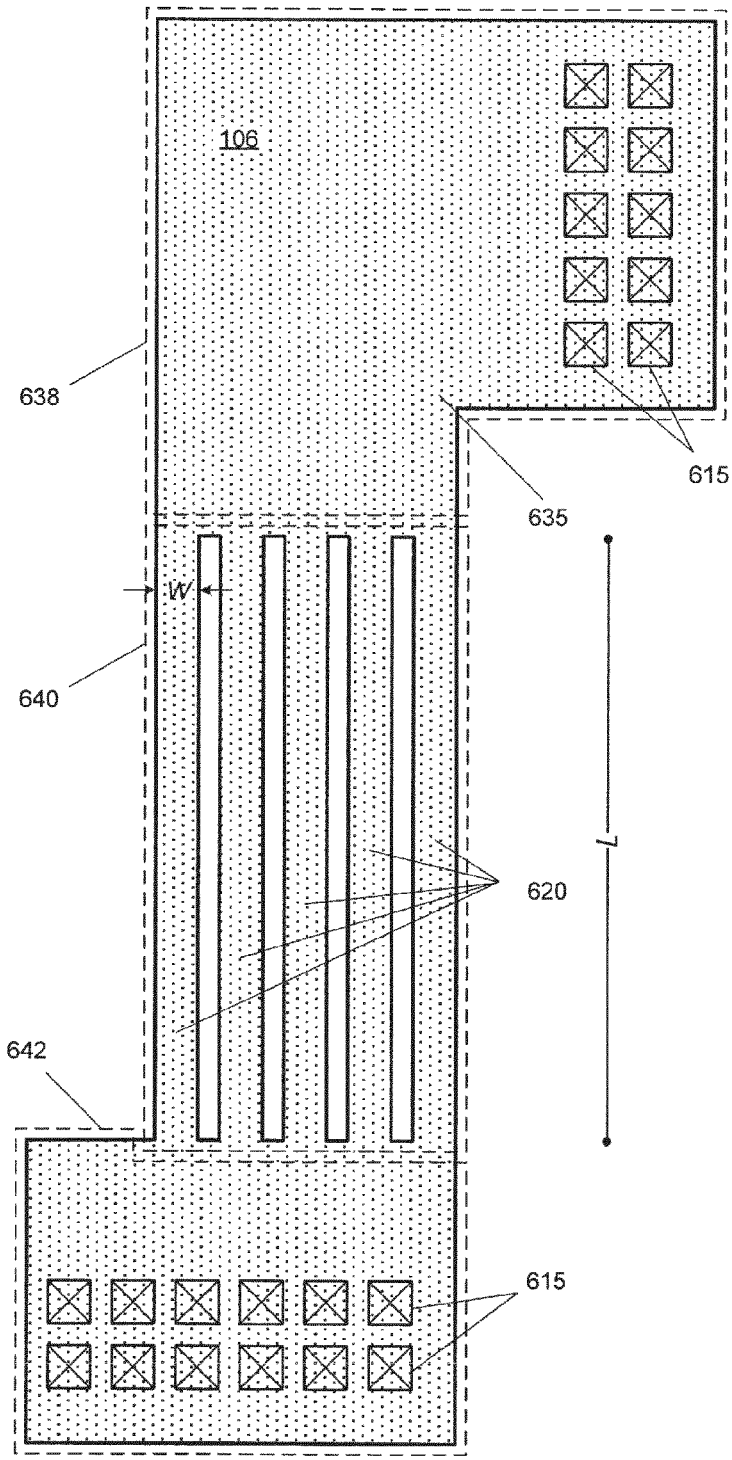
FIG. 20 depicts one embodiment of a thin-film heating member.

By way of explanation, but without being bound to a particular design, FIG. 20 depicts one design of a heater 106 that the inventors have studied for purposes of improving operational characteristics of a heat-trimmable resistor. The design shown comprises two connecting regions 638, 642, and an active heating portion or region 640. The connecting regions may include portions extending through vias 615 for establishing electrical contact to an underlying conductor, e.g., an underlying conductive metal trace or interconnect. The connecting regions may provide a path for current between interconnects and the active heating portion 640 of the heating element. The active heating portion 640 may comprise one or a plurality of active heating members 620, e.g., legs having length L and width W. In various embodiments, the active heating portion 640 generates heat for trimming a heat-trimmable resistive element 108 (not shown) disposed in close proximity to the active heating portion 640. The active heating portion 640 is intended to be the main heating region of the device. The active heating portion may be in close proximity to at least a portion of a heat-trimmable resistive element 108, and in some embodiments may be in close proximity to substantially all of a heat-trimmable resistive element.

The inventors have recognized that when current is applied to the heater 106, power may be dissipated in all regions, i.e., in the active heating portion 640 and also in connecting regions 638, 642, and that power dissipated in connecting regions may be lost since the connecting regions may not be proximal to resistive material 108. Power used for generating heat in the non-active connecting regions 638, 642 is generally lost and therefore reduces the efficiency of the heat-trimmable resistor. The inventors have also recognized that "hot spots" may occur in the connecting regions, e.g., at location 635, or at non-uniformities in the connecting region thin-film pattern. The inventors have also found that an appreciable amount of heat can be produced at contact locations between the heater 106 and an interconnect, e.g., at the location of the vias 615. High current loading and resulting heat generation can lead to excessive temperatures, and may lead to device failure. Accordingly, the inventors have designed the heat-trimmable resistor to mitigate hot spots and reduce power losses in non-active regions of the device.

FIGS. 21A-21C depict several embodiments of thin-film heaters for heat-trimmable resistors. In FIG. 21A, a thin-film heater 610a comprises electrically-conductive material 605 and a plurality of active thin-film heating legs 620a. Each leg has a length L and width W. Though the legs are shown as being of the same length and width, in some embodiments, the lengths and widths of the legs may vary within a heating element. The legs 620a may overlap the conductive material a distance D, which may be a same amount or different amount at opposing ends of the legs 620a. Though shown as straight legs in the drawing, legs 620a may not be straight in other embodiments. For example, the legs may include wavy patterns or zig-zag patterns. FIG. 21B depicts an embodiment in which a thin-film heater 610b comprises a single broad leg 620b that overlaps conductive material 605 by substantially an equal amount at each end of the leg. FIG. 21C depicts an embodiment of a heater 610c similar to that shown in FIG. 21A, except the number of heating legs differs and the legs 620c are connected at the opposing ends. In various embodiments, the electrically-conductive material 605 is in electrical contact with the active heating members, so that current may flow through the conductive material 605 to the active heating members.

The electrically-conductive material 605 may form a "heater connector" that connects an active area 640 of the thin-film heater, e.g., the region or portion containing the active heating members, with nearby conductive interconnects such as metal interconnects. Though the electrically-conductive material 605 is shown primarily as blocks in FIG. 21A-21C, the electrically-conductive material 605 may be patterned in any suitable shape. In some embodiments, the electrically-conductive material may be long traces providing interconnectivity within an integrated circuit on the same substrate. In some implementations, electrically-conductive material 605 may include one or more exposed contact areas near the heat-trimmable resistor, or may connect to one or more exposed metal contacts, so that external access is provided for applying current to the heater. For example, the exposed contacts may be accessed by probes of an instrument used at a manufacturing facility for applying current and trimming resistance on a wafer or chip.

According to some embodiments, the sheet resistance $R_{s,c}$ of electrically-conductive material 605 is lower than the sheet resistance $R_{s,h}$ of the active thin-film heating members 620a, 620b, 620c. $R_{s,c}$ may be lower than $R_{s,h}$ by a factor of between about 1.5 and about 2 in some embodiments, between about 2 and about 4 in some embodiments, between about 4 and about 8 in some embodiments, between about 8 and about 16 in some embodiments, between about 16 and about 32 in some embodiments, between about 32 and about 64 in some embodiments, and yet between about 64 and about 128 in some embodiments. The sheet resistance of the electrically-conductive material 605 may be between about 0.01 ohm/sq and about 0.1 ohm/sq ins some embodiments, between about 0.1 ohm/sq and about 1 ohm/sq ins some embodiments, and yet between about 1 ohm/sq and about 10 ohms/sq ins some embodiments. In some implementations, the electrically-conductive material 605 may comprise Al. In some embodiments, the electrically-conductive material 605 may comprise copper. In some cases, the electrically-conductive material 605 may comprise a combination of materials including Al and Cu. According to one embodiment, the electrically-conductive material comprises AlSiCu, and has a sheet resistance between about 0.1 ohms/sq and about 0.2 ohm/sq. The thickness of the electrically-conductive material 605 may be between about 70 nm and about 150 nm. According to one embodiment, the thickness of the electrically-conductive material 605 is about 100 nm.

The active thin-film heating members may be formed from TaAl and have a sheet resistance $R_{s,h}$ between about 20 ohms/sq and about 100 ohms/sq. According to one embodiment, the active thin-film heating members 620a, 620b, 620c have a sheet resistance of about 50 ohms/sq. The thickness of the active thin-film heating members may be between about 20 nm and about 80 nm. According to one embodiment, the thickness of the active thin-film heating members is about 50 nm.

The active thin-film heating members may be deposited as a substantially uniform layer and then etched into any suitable pattern, such as those shown in FIGS. 21A-21C, using photolithographic and microfabrication techniques (e.g., photolithographic patterning of a resist followed by reactive ion etching). In some instances, thin-film heating members may be deposited in a desired pattern onto a wafer using lift-off processing techniques, or by deposition through a stencil mask held in close proximity to the wafer. Regardless of the technique used to pattern the thin-film heating members 620, the heating members may be patterned substantially only in an active area 640 of the heat-trimmable resistor, and be physically and/or electrically contacted to the electrically-conductive material 605. The electrically-conductive material may be patterned substantially only in non-active regions 638, 642 of the heat-trimmable resistor.

FIG. 22A depicts a thin-film resistive element 630a that may be formed in close proximity to active heating members of a heater on a wafer or chip. The resistive element 630a may comprise one or more legs through which current may pass. In some embodiments, the resistive element comprises a single length of resistive material formed in a serpentine pattern, as shown in FIG. 22A. Though portions of the resistive element are shown as being long and straight, these portions may be wavy or zig-zag in other embodiments. Additionally, the pattern of the resistive material 630a need not be rectilinear, but may include curved portions (e.g., uniformly curved in a semi-circle where the resistive element reverses directions. In some implementations, the elongate portions of the resistive element 630a may be connected at the ends by oversized rectangles, squares, ellipses, semi-ellipses, semi-circles, or circles. The orientation of long portions may or may not be aligned with legs of nearby heater. For example, the long portions of the thin-film resistive element 630a may be aligned substantially orthogonal, or at any angle, with respect to the active heating members of the heater, as depicted in FIG. 22B.

Figure 23A:
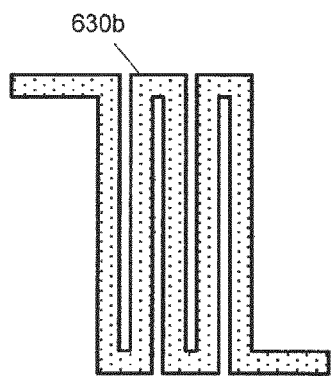
FIGS. 23A-23B depict plan views of another embodiment of a thin-film resistive element and overlying heating members.
Figure 23B:
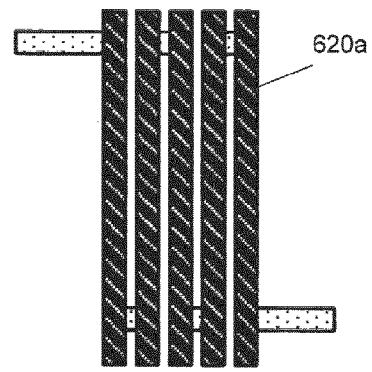

In other embodiments, the thin film resistive element 630b may be patterned and aligned such that long portions of the resistive element are substantially aligned with legs 620a of the heater, as depicted in FIGS. 23A-23B. In some embodiments, the active heating legs 620a may be patterned to cover and be in close proximity to substantially all of the thin-film resistive element 630b, as shown in FIG. 23B. In other embodiments, the active heating members may be patterned to cover and be in close proximity to a portion of the thin-film resistive element, for example as shown in FIGS. 23C and 22B.

Figure 23C:
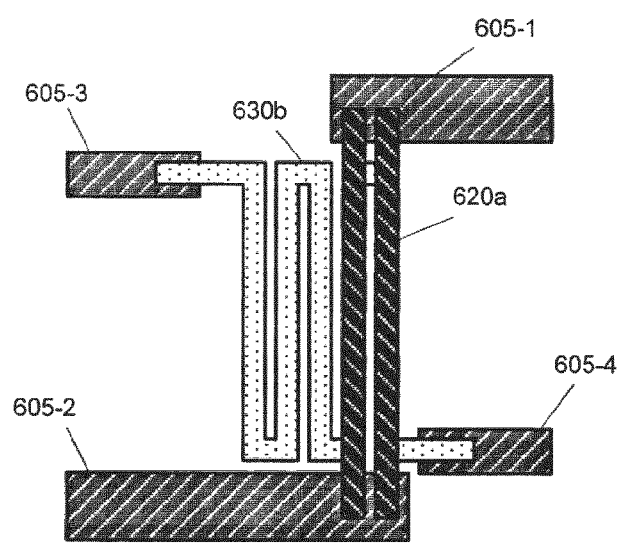
FIG. 23C is a plan view showing electrically conductive material 605 patterned to form electrical connections with the heating members 620$a$ and thin-film resistive element 630$b$, according to one embodiment.

As shown in FIG. 23C, ends of active heating legs 620a may be configured to electrically contact the electrically-conductive material 605-1, 605-2. Electrically-conductive material 605-1, 605-2 may further be patterned to form contacts with nearby metal traces or conductive interconnects, e.g. through one or more vias. Electrical current may be applied through active heating members 620a via the electrically-conductive material 605-1, 605-2. The electrical current may be applied as one or more short pulses, e.g., pulse durations less than 1 second, less than 100 milliseconds, or less than 10 milliseconds in various embodiments. The electrical current passing through active heating members 620a can produce high temperatures in the heating members, and heat may be transferred to at least a portion of the thin-film resistive element 630b that is proximal the active heating members 620a. When the thin-film resistive element 630b is a short distance from the active heating members (e.g., between about 50 nm and about 250 nm), then the heat may transfer from the heater to the resistive element in a time period on the order of a few microseconds or a few tens of microseconds. According to one embodiment, the thin-film resistive element 630b lies about 150 nm distance below the heating members 620a on a substrate.

The thin-film resistive element 630b may also connect to conductive material 605-3, 605-4 at distal ends. In some embodiments, the conductive material 605-3, 605-4 may be the same as the conductive material 605-1, 605-2 used for connections at the ends of the active heating members 620a. In other embodiments, the conductive material 605-3, 605-4 may be different than that used for the heating members.

Figure 24A:
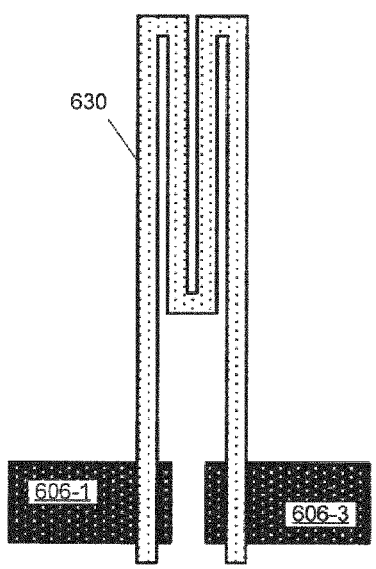
FIGS. 24A-24B depict plan views of another embodiment of a thin-film resistive element 630 and overlying heating member 620 that electrically connects to electrically-conductive material 605. The thin-film resistive element electrically connects to underlying metal interconnects 606.
Figure 24B:
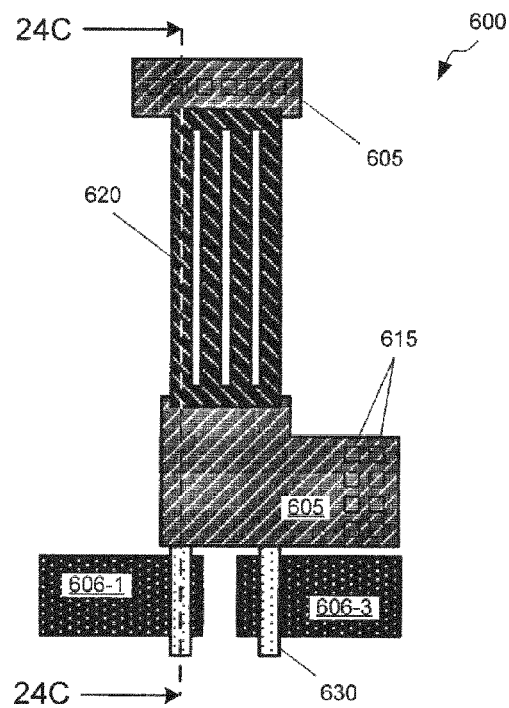
Figure 24C:
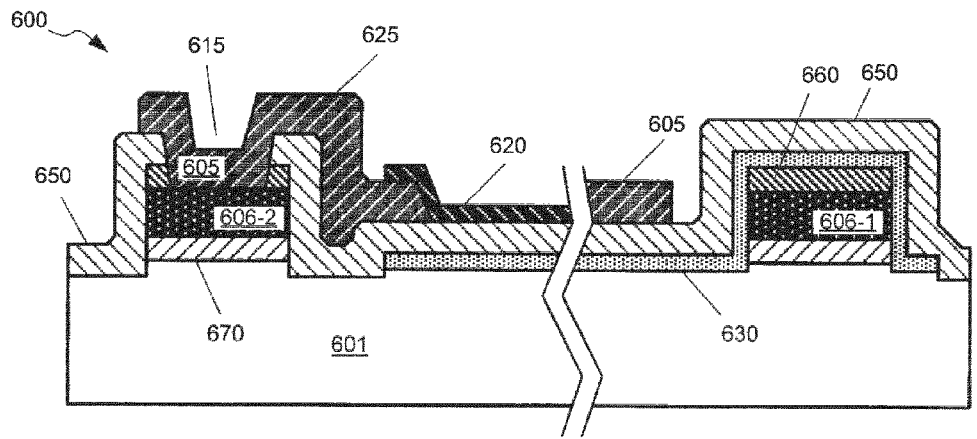
FIG. 24C is an elevation view corresponding to the structure shown in FIG. 24B.

FIGS. 24A-24C depict an embodiment in which a thin-film resistive element 630 connects to a metal interconnect 606 directly, and the heating members 620 connect to electrically-conductive material 605, which in turn connects to a metal interconnect (not shown in the drawing) through vias 615. The metal interconnect may comprise any one of or a combination of Al, Cu, Au, Ti, Ni, W, and Cr. The thickness of the metal interconnect may be between about 300 nm and about 1500 nm. FIG. 24A depicts a plan view of the thin-film resistive element 630, and FIG. 24B depicts a plan view of the heating members 620 and electrically-conductive material 605 overlying the resistive element 630 according to one embodiment. As can be seen in the drawings, the heating members 620 are substantially limited in spatial extent to an active area of the thin-film resistor 600 in which generated heat is intended to alter the resistance of a selected portion of the proximal resistive element 630. Electrically-conductive material 605 provides connections to the heating members and extends across non-active areas of the thin-film resistor 600.

An elevation view of one embodiment of a thin-film resistor 600 is depicted in FIG. 24C. The view corresponds to a cross section of the device as indicated in FIG. 24B. For this embodiment, the thin-film resistive element 630 directly contacts sidewalls of a first metal conductor 606-1. A heater connector 625 made of electrically-conductive material 605 connects the heating members 620 to a second metal conductor 606-2. Metal conductors 606-1 and 606-2 may have been deposited at a same time during device fabrication. Electrically-conductive material 605 may contact the second metal conductor 606-2 through one or more vias 615.

The thin-film resistor 600 may be formed on a substrate comprising an isolating layer 601 that provides an amount of electrical and thermal isolation between the thin-film resistor 600 and other devices and/or features on the substrate. The substrate (not shown) may be a semiconductor wafer, an integrated circuit chip, or any wafer or substrate on which micro-scale devices (e.g., integrated circuits, MEMs, and/or microfluidic devices) are formed. The isolating layer 601 may comprise silicon oxide, e.g., $SiO_2$, or any other suitable material that provides electrical and thermal insulation. The thickness of the isolating layer 601 may be greater than about 100 nm in some embodiments, greater than about 300 nm in some embodiments, and yet greater than about 500 nm in other embodiments. In some implementations, the entire substrate may be insulating and provide electrical and thermal isolation, e.g., a fused silica or quartz substrate. In embodiments where the entire substrate provides electrical and thermal isolation, the isolating layer 601 may be omitted.

In some embodiments, a barrier layer 670 is provided between a conductor and isolating layer 601. The barrier layer may comprise TiN and have a thickness between about 25 nm and about 200 nm. The barrier layer may have a moderate or low sheet resistance (e.g., less than about 25 ohms/sq). The barrier layer may not exhibit or minimally exhibit electromigration effects.

In various embodiments, a dielectric layer 650 is disposed between the thin-film resistive element 630 and the heating members 620. The dielectric layer 650 may extend across other regions of the substrate 601, as shown in FIG. 24C for example. The dielectric layer 650 may provide high electrical isolation, so as to prevent current flow between the active heating members 620 and thin-film resistive element 630. In some embodiments, the dielectric layer 650 also provides high thermal conductivity between the heating members and thin-film resistive element. In one embodiment, the dielectric layer 650 comprises $Si_3N_4$. SiC may be used for the dielectric layer 650 in some embodiments. The thickness of the dielectric layer may be between about 50 nm and about 250 nm. According to one embodiment, the thickness of the dielectric layer is about 150 nm.

The active heating members 620 may be formed of a material that exhibits high current-to-temperature conversion, and is stable and capable of sustaining high temperatures for at least a few milliseconds. In some embodiments, the heating members 620 are capable of sustaining high temperatures for a few tens of milliseconds, and in some cases hundreds of milliseconds. The heating members 620 may be capable of generating temperatures between about 600 degrees Celsius and about 1000 degrees Celsius. As noted above, the thin-film heating members may be formed from TaAl and have a sheet resistance $R_{s,h}$ between about 20 ohms/sq and about 100 ohms/sq. In some embodiments, the thickness of the active thin-film heating portion may be between about 5 nm and about 100 nm.

The thin-film resistive element 630 may be formed from a material exhibiting high sheet resistance characteristics, and for which the sheet resistance changes with applied high temperatures. According to one embodiment, the thin-film resistive element 630 comprises CrSi and has a thickness of about 5 nm. In some embodiments, the thickness of the thin-film resistive element 630 may be between about 3 nm and about 20 nm.

A quantitative value of heating efficiency $\eta_e$ may be defined for a thin-film resistor 600 as follows.

$$\eta_e = \Theta/P \quad (1)$$

In EQ. 1, $\Theta$ represents an average temperature difference (e.g., expressed in degrees Celsius) measured at the thin-film resistive element 630 within an active area of the device that is due to the power P applied to the heater. According to this expression, a heat-trimmable, thin-film resistor with a higher heating efficiency $\eta_e$ will generate higher temperatures at the thin-film resistive element 630 for a given applied power P than a device with a lower heating efficiency. To investigate the effect of device design on heating efficiency and other device parameters, the inventors carried out several experiments in which the design of the heating element was varied. Results from these experiments are described in the section entitled "Examples" below.

Figure 24D:
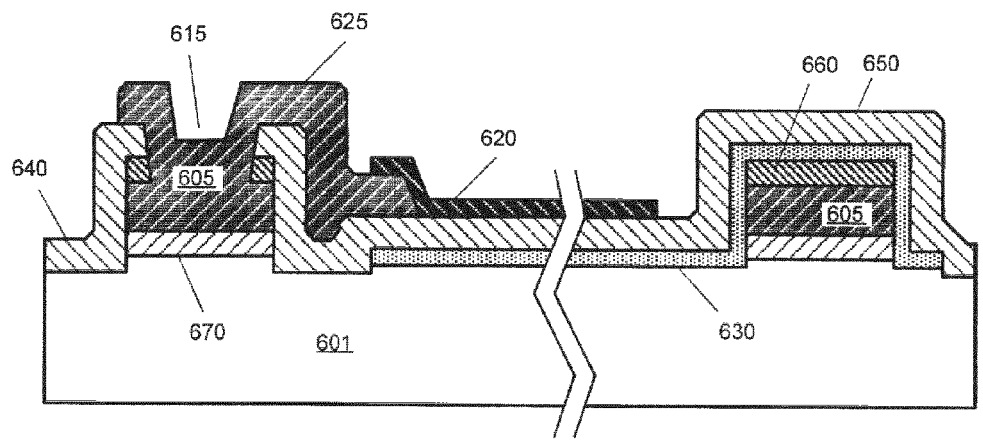
FIG. 24D is an elevation view corresponding to the structure shown in FIG. 24B, but where the underlying interconnects are formed from the same material as the heater connector 625.

FIG. 24D depicts an elevation view of a heat-trimmable, thin-film resistor that is similar to that shown in FIG. 24C. For the embodiment shown in FIG. 24D, the interconnects (e.g., 606-1 and 606-2 of FIG. 24C) and heater connector 625 are formed from a same electrically conductive material, e.g., AlSiCu. The heater connector 625 may be deposited after the interconnects, and before the heating members 620.

A process for fabricating heat-trimmable, thin-film resistors is outlined in FIGS. 25A-25D. One embodiment of a process is described as consisting of a series of deposition steps, followed by patterning of a resist, and etching of the previously-deposited material where the resist masks underlying material from being etched. After etching, the resist may be stripped from the substrate. It will be appreciated that alternative processing techniques may be used to obtain substantially similar results. For example, lift-off processing may be used where a resist is first patterned, and material is subsequently deposited over the resist and open areas. Material on the resist would be removed in a lift-off step where the resist is stripped from the substrate, and material falling on open areas would remain on the substrate.

Figure 25A:
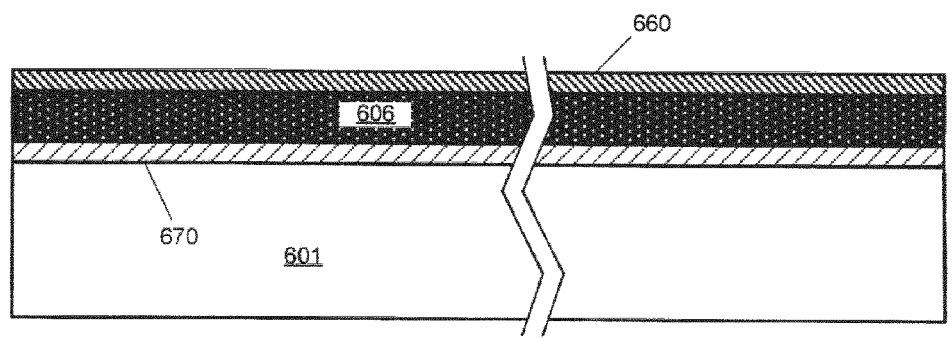
FIGS. 25A-25D are elevation views for illustrating intermediary structures during process steps carried out to form a heat-trimmable, thin-film resistor, in accordance with one embodiment.

According to one method of processing, a barrier layer 670, interconnect material 606, and anti-reflective coating (ARC) 660 are deposited on a dielectric layer 601 yielding a structure shown in FIG. 25A. A resist (not shown) may then be patterned over the ARC layer 660 to cover or protect selected areas of the substrate and exposes other areas. The resist may comprise a hard resist, e.g., a metal or inorganic material, or may comprise a soft resist, e.g., a polymer or photoresist. The resist protects underlying material from a subsequent etching step.

Figure 25B:
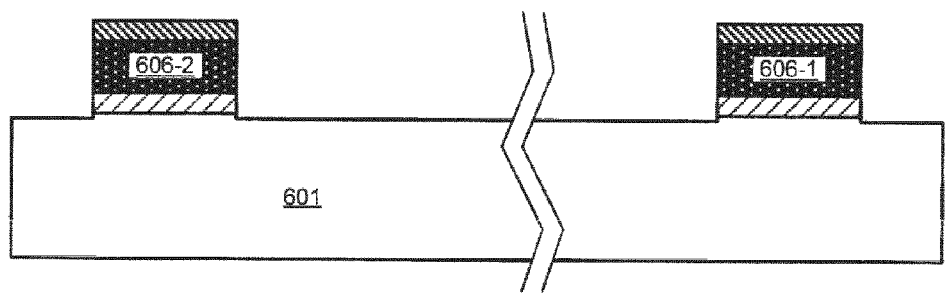
Figure 25C:
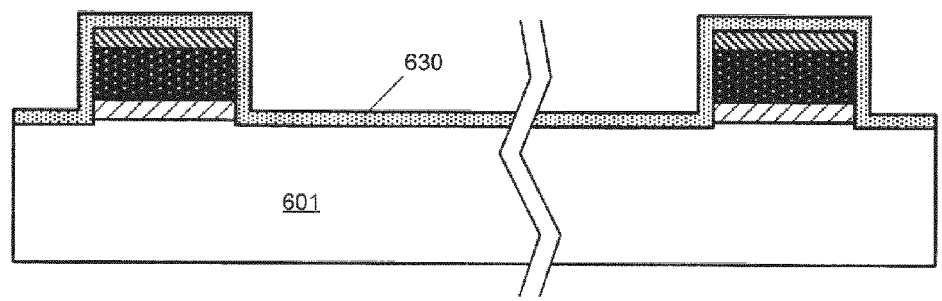
Figure 25D:
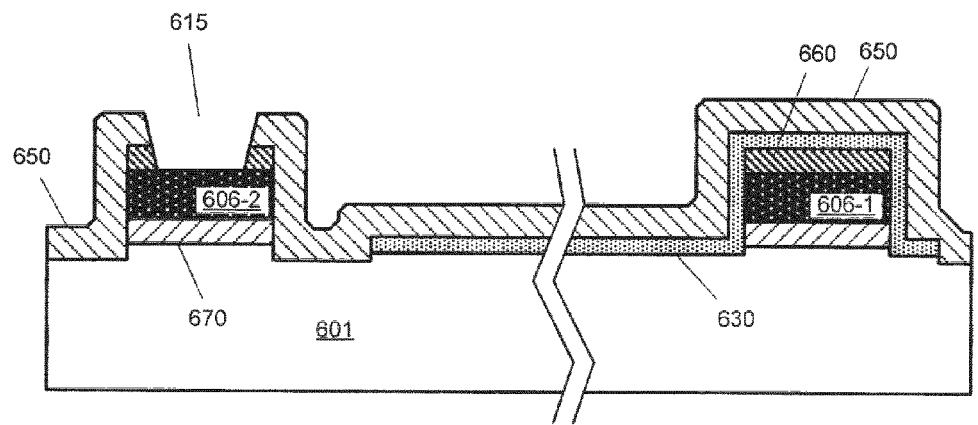

A subsequent etching step may be carried out to form patterned interconnects as depicted in FIG. 25B. The etching may be a dry etch, e.g., reactive ion etching (RIE). Following the etching, any remaining resist may be stripped from the substrate. Next, a thin-film resistive material 630 may be deposited on the substrate, as shown in FIG. 25C. Similar to the preceding steps, a resist may be patterned over the thin-film resistive material 630, and a subsequent etch may be used to pattern the thin-film resistive material to any suitable pattern, e.g., that shown in FIG. 25D (elevation view) and FIG. 24A (plan view). Any remaining resist may be stripped from the substrate, and a dielectric layer 650 deposited on the substrate. Again, resist patterning, etching, and resist stripping may be used to open one or more vias 615 to an interconnect 606-2, as depicted in FIG. 25D.

Electrically-conductive material 605 for the heater connector 625, with reference to FIG. 24C, may then be deposited. Because of the vias 615, heater connector may be deposited in physical contact with interconnect 606-2. In some embodiments, an intermediate layer may be deposited between the interconnect and heater connector. The intermediate layer may be electrically conductive and may promote adhesion and or reduce contact resistance at the junction. Deposition of the electrically-conductive material 605 may be followed by resist patterning, etching, and resist stripping to pattern one or more heater connectors 625 for the device. Material for the active heating members 620 may be deposited and patterned using similar patterning steps to form patterned heating members as depicted in FIG. 24B, for example. The material for the heating members may be deposited in physical and/or electrical contact with the heater connector 625. The patterning steps for the heating members may also include resist patterning, etching, and resist stripping, as described above. In some embodiments, a passivating layer or a planarizing layer (not shown) may be deposited over the entire heat-trimmable, thin-film resistor 600.

EXAMPLES

Figures 26A, 26B:
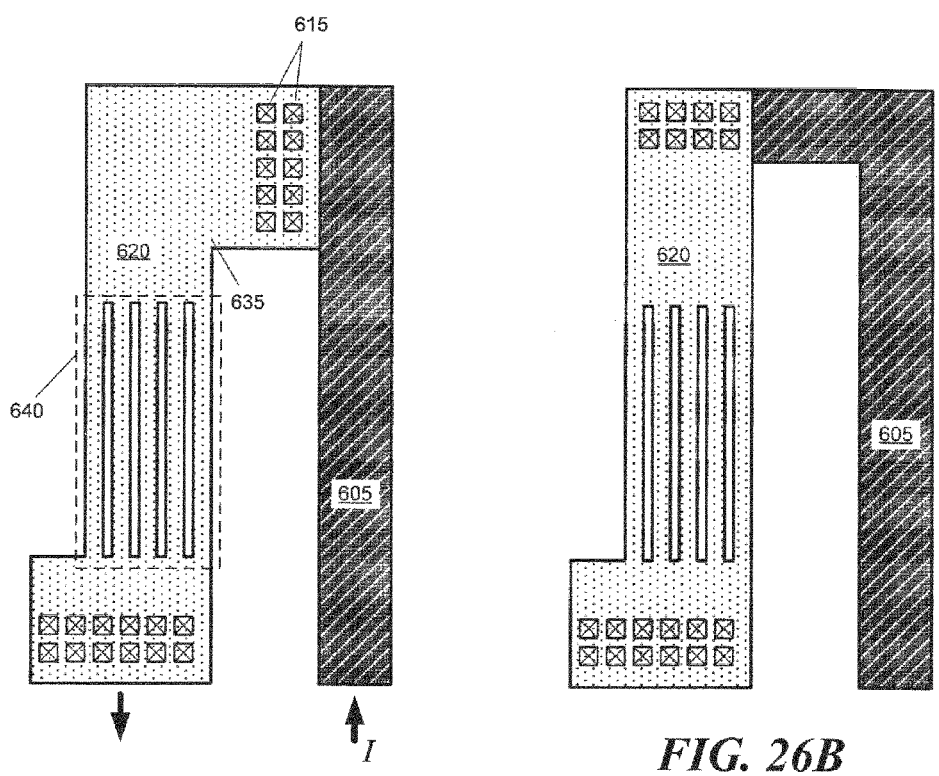
FIGS. 26A-26C are plan views depicting various designs of heating elements trialed for a heat-trimmable, thin-film resistor.
Figure 26C:
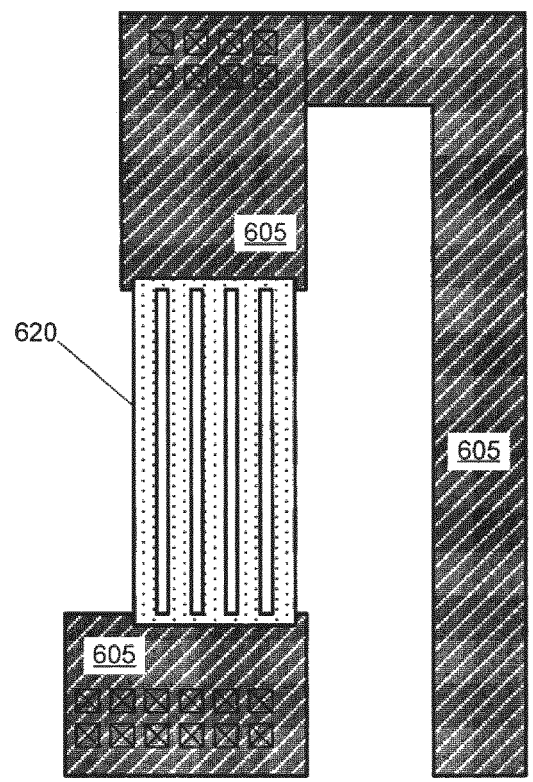

Several experiments were carried out to investigate effects of heater design variations on heating efficiency and performance of a heat-trimmable, thin-film resistor. In the experiments, three designs were trialed. The designs tested are depicted in FIGS. 26A-26C. The first design, depicted in FIG. 26A, included a leg of electrically conductive material 605 that provided current to distributed heater 620. The electrically-conductive material 605 had significantly lower sheet resistance than that of the heater. The heater comprised an active region 640 patterned to have a plurality of straight legs of length L and width W. The active area was configured to be in close proximity to an underlying resistive element (not shown). There were significant portions of the heater that did not overly the resistive element and were of the same material and thickness as the active region. Connection between the heater 620 and conductive material 605 was established through a plurality of vias located to one side of a lead-in portion of the heating member.

The second design, depicted in FIG. 26B, was similar to the first, except that the conductive material was extended further into the lead-in portion of the heater, and the via contacts were formed across an end of the heater. For the second design, substantially uniform and linear current flow could be obtained through the heater. For the third design, shown in FIG. 26C, the electrically-conductive material was patterned to cover substantially all non-active areas of the device.

The materials and general structures trialed for the three devices are summarized in Table 1. For these trials, the interconnects and heater connectors were formed from the same material (AlSiCu).

TABLE 1

| Layer | Material | Thickness |
|---|---|---|
| dielectric 601 | SiO2 | >500 nm |
| barrier 670 | TiN | ~75 nm |
| interconnect 606, 605 | AlSiCu | ~1000 nm |
| heater dielectric 650 | Si3N4 | ~150 nm |
| heater connector 625 | AlSiCu | ~100 nm |
| heating element 620 | TaAl | ~90 nm |
| thin-film resistive element 630 | CrSi | ~5 nm |

A comparison of device parameters for the designs shown in FIGS. 26A-26C is listed in Table 2. The table shows that the third design (FIG. 26C) performs significantly better than the other designs in terms of heating efficiency and temperatures in non-active areas and at the heater-to-interconnect connection. For example, the average temperature for non-active regions of the third design was less than 100° C., whereas the average temperatures for non-active regions of the first and second designs were about 180° C. and about 260° C., respectively. The heater-to-interconnect connection temperature for the third design was about 80° C., and for the other designs the temperature at the same connections was nearly twice as high. Excessive temperatures at the connection can lead to junction failure. A maximum device temperature of about 580° C. was observed for the first design, near the interior corner 635. Such a high temperature is undesirable in a non-active region. Higher temperatures in non-active regions represent wasted power, and can lead to device failure. The results of Table 2 show that lower temperatures in non-active areas can be obtained by incorporating low-sheet-resistance heater connectors into the heat-trimmable resistor 600.

Though Table 2 shows the active area temperature of the third design being less than the active area temperatures of the other two designs, the consumed power for the third design is significantly less than consumed power for the other designs (about 0.7 watt for the third design compared to about 1 watt for the other designs). A more meaningful comparison is the heating efficiency $\eta_e = \Theta/P$ shown in the last row of the table. For an equivalent amount of power (~1 watt) supplied to the heating element of FIG. 26C, a higher temperature in the active area would be observed.

TABLE 2

| | Design | | |
|---|---|---|---|
| | 1 (FIG. 26A) | 2 (FIG. 26B) | 3 (FIG. 26C) |
| Max J (A/$\mu m^2$) | 0.3151 | 0.2274 | 0.1173 |
| Max temp (° C.) | 580.21 | 357.649 | 320.574 |
| Heater/Metal connection (° C.) | 148.38 | 159.72 | 81.75 |
| Non active area temperature (° C.) | 178.27 | 263.02 | 96.96 |
| Active area temperature $\Theta$ (° C.) | 344.27 | 350.24 | 317.05 |
| Resistance ($\Omega$) | 278.98 | 299.41 | 193.66 |
| Power, P (W) | 1.00 | 1.08 | 0.70 |
| Efficiency, $\Theta/P$ (° C./W) | 342.79 | 324.94 | 454.76 |

Based on the results of Table 2, variations to the third design (shown in FIG. 26C) were made, several tests performed, and results from these tests are recorded in Table 3. For these trials, the width of the active heating legs 620 and their lengths were varied while the pattern for an underlying resistive element was not changed. Values selected for lengths of the heating legs were 99 microns, 109 microns, 119 microns, and 129 microns. The longer lengths extended beyond the underlying resistive element, whereas the shortest length (99 microns) had no extension beyond the resistive element. Values trialed for leg widths were 3, 4, 5, and 6 microns. The center-to-center spacing of the legs remained constant, so that gaps between the legs increased for the narrower widths. The current applied to each device was about 60 mA. In some low current trials, it was found that resistance trimming could be obtained with currents as low as 20 mA. The thickness of the heating legs 620 was about 90 nm, providing a sheet resistance of about 27 ohms/sq.

Of the values listed in Table 3, the heating efficiency provides a more meaningful measure of device performance. Some general trends are observable. First, narrower legs of the heating element produce higher temperatures in the active area and yield higher overall heating efficiency. This seems somewhat counterintuitive, since there were larger gaps (i.e., non-heating regions that could provide a sink for heat) between the narrower legs. Second, minimizing any extensions of the heater leg length over non-active areas of the device yield higher heating efficiencies.

It will be appreciated in view of the results of Table 3 that the design of FIG. 26C provides a measure of flexibility in heater design. For example, when looking at the temperatures of the active heater area, variations in heater leg extensions contribute a small variation in temperature achieved. A 30 micron extension results in a temperature that is about 4% higher than a similar design with no extension. However, altering the width of the heating legs can appreciably affect temperature in the active area. A variation from 3 microns to 6 microns can affect temperature by more than a factor of two. Accordingly, an engineer can select an active heating member design (e.g., heating leg width) to obtain a desired temperature in the active heating area of a heat-trimmable, thin-film resistor.

TABLE 3

| TaAl thickness ($\mu m$) | Length of active heater leg ($\mu m$) | Width of active heater leg ($\mu m$) | Active heater temperature (° C.) | Total Resistance ($\Omega$) | Power, P (W) | Efficiency, $\Theta/P$ (° C./W) | Area of active heater leg, A ($\mu m^2$) |
|---|---|---|---|---|---|---|---|
| 0.0875 (27.4 $\Omega$/sq) | 99 (zero extension) | 3 | 504.56 | 288.00 | 1.04 | 462.54 | 297.00 |
| | | 4 | 345.34 | 229.88 | 0.83 | 387.09 | 396.00 |
| | | 5 | 256.50 | 194.83 | 0.70 | 330.06 | 495.00 |
| | | 6 | 205.07 | 171.42 | 0.62 | 291.79 | 594.00 |

TABLE 3-continued

| TaAl thickness (μm) | Length of active heater leg (μm) | Width of active heater leg (μm) | Active heater temperature (° C.) | Total Resistance (Ω) | Power, P (W) | Efficiency, θ/P (° C./W) | Area of active heater leg, A (μm²) |
|---|---|---|---|---|---|---|---|
| | 109 | 3 | 520.06 | 310.85 | 1.12 | 442.39 | 327.00 |
| | (10 μm ext.) | 4 | 355.57 | 247.02 | 0.89 | 371.74 | 436.00 |
| | | 5 | 264.31 | 208.55 | 0.75 | 318.75 | 545.00 |
| | | 6 | 210.22 | 182.83 | 0.66 | 281.40 | 654.00 |
| | 119 | 3 | 517.42 | 333.70 | 1.20 | 409.90 | 357.00 |
| | (20 μm ext.) | 4 | 354.76 | 264.15 | 0.95 | 346.77 | 476.00 |
| | | 5 | 263.50 | 222.25 | 0.80 | 298.09 | 595.00 |
| | | 6 | 205.41 | 194.27 | 0.70 | 257.96 | 714.00 |
| | 129 | 3 | 520.17 | 356.53 | 1.28 | 385.79 | 387.00 |
| | (30 μm ext.) | 4 | 352.52 | 281.30 | 1.01 | 323.42 | 516.00 |
| | | 5 | 264.29 | 235.97 | 0.85 | 281.68 | 645.00 |
| | | 6 | 207.64 | 205.70 | 0.74 | 246.64 | 774.00 |

The foregoing detailed description has set forth various embodiments of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one embodiment, the present subject matter may be implemented via Application Specific Integrated Circuits (ASICs). However, those skilled in the art will recognize that the embodiments disclosed herein, in whole or in part, can be equivalently implemented in standard integrated circuits, as one or more programs executed by one or more processors, as one or more programs executed by one or more controllers (e.g., microcontrollers), as firmware, or as virtually any combination thereof, and that designing the circuitry and/or writing the code for the software and or firmware would be well within the skill of one of ordinary skill in the art in light of this disclosure.

When logic is implemented as software and stored in memory, it would be equivalent that logic or information can be stored on any computer readable storage medium for use by or in connection with any processor-related system or method. In the context of this document, a memory is a computer readable storage medium that is an electronic, magnetic, optical, or other physical device or means that contains or stores a computer and/or processor program and/or data or information. Logic and/or the information can be embodied in any computer readable storage medium for use by or in connection with an instruction execution system, apparatus, or device, such as a computer-based system, processor-containing system, or other system that can fetch the instructions from the instruction execution system, apparatus, or device and execute the instructions associated with logic and/or information.

Use of ordinal terms such as "first," "second," "third," etc. in the claims to modify a claim element or item in the specification does not by itself connote any priority, presence or order of one element over another. In addition, the use of an ordinal term does not by itself connote a maximum number of elements having a certain name that can be present in a claimed device or method. Any suitable number of additional elements may be used unless a claim requires otherwise. Ordinal terms are used in the claims merely as labels to distinguish one element having a certain name from another element having a same name. The use of terms such as "at least one" or "at least a first" in the claims to modify a claim element does not by itself connote that any other claim element lacking a similar modifier is limited to the presence of only a single element. Any suitable number of additional elements may be used unless a claim requires otherwise. The use of "including," "comprising," or "having," "containing," "involving," and variations thereof herein, is meant to encompass the items listed thereafter and equivalents thereof as well as additional items.

The indefinite articles "a" and "an," as used herein in the specification and in the claims, unless clearly indicated to the contrary, should be understood to mean "at least one."

The terms "substantially equivalent to" and "approximately equal to" and their equivalents should be understood to mean that a first element is equivalent to or nearly equivalent to a second element. In some embodiments, the degree of equivalence may be within about ±2%, in some embodiments within about ±5%, in some embodiments within about ±10%, and yet in some embodiments within about ±20%.

The various embodiments described above can be combined to provide further embodiments. From the foregoing it will be appreciated that, although specific embodiments have been described herein for purposes of illustration, various modifications may be made without deviating from the spirit and scope of the teachings. Accordingly, the claims are not limited by the disclosed embodiments.

What is claimed is:

1. A heat-trimmable resistor comprising:
    a thin-film resistive element configured as a resistor that is connected to or connectable to a circuit;
    a thin-film heating region proximal at least a portion of the thin-film resistive element; and
    an electrically-conductive material in electrical contact with the thin-film heating region and having lower sheet resistance than the thin-film heating region that connects the thin-film heating region to a conductive interconnect.

2. The heat-trimmable resistor of claim 1 incorporated in an integrated circuit.

3. The heat-trimmable resistor of claim 1, wherein the thickness of the electrically-conductive material is greater than the thickness of the thin-film heating region.

4. The heat-trimmable resistor of claim 3, wherein the thickness of the electrically-conductive material is greater than about 10 nm.

5. The heat-trimmable resistor of claim 3, wherein the thickness of the electrically-conductive material is greater than about 50 nm.

6. The heat-trimmable resistor of claim 1, wherein the electrically-conductive material comprises aluminum.

7. The heat-trimmable resistor of claim 6, wherein the electrically-conductive material further comprises copper.

8. The heat-trimmable resistor of claim 1, wherein an active area heating efficiency of the heat-trimmable resistor is greater than about 350° C./W.

9. The heat-trimmable resistor of claim 1, wherein the thin-film resistive element is patterned to have one or a plurality of elongated legs and the thin-film heating region is separated from the one or a plurality of elongated legs by at least one thermally-conductive material.

10. The heat-trimmable resistor of claim 9, wherein the plurality of legs are substantially parallel.

11. The heat-trimmable resistor of claim 9, wherein the plurality of legs are configured in a serpentine pattern.

12. The heat-trimmable resistor of claim 9, wherein the one or plurality of legs each have a length between about 10 microns and about 300 microns.

13. The heat-trimmable resistor of claim 9, wherein the one or plurality of legs each have a width between about 250 nm and about 10 microns.

14. The heat-trimmable resistor of claim 9, wherein the electrically-conductive material is deposited proximal to at least one end portion of the one or plurality of elongated legs.

15. The heat-trimmable resistor of claim 14, wherein the deposited electrically-conductive material is deposited to connect to at least one end portion of the thin-film heating region.

16. The heat-trimmable resistor of claim 14, wherein the electrically-conductive material further electrically connects with an underlying first electrical conductor.

17. The heat-trimmable resistor of claim 16, wherein the connection with the first electrical conductor is formed through at least one via.

18. The heat-trimmable resistor of claim 16, wherein the thin-film resistive element electrically connects with a second electrical conductor.

19. The heat-trimmable resistor of claim 18, wherein the first electrical conductor and second electrical conductor are deposited at the same time.

* * * * *